(12) United States Patent
Park et al.

(10) Patent No.: US 11,404,498 B2
(45) Date of Patent: Aug. 2, 2022

(54) DISPLAY DEVICE HAVING FINGERPRINT SENSING FUNCTION AND METHOD OF OPERATING THE SAME

(71) Applicant: Samsung Display Co., Ltd., Yongin-si (KR)

(72) Inventors: Hyeon-Do Park, Gwangmyeong-si (KR); Hyo-chul Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/995,701

(22) Filed: Aug. 17, 2020

(65) Prior Publication Data

US 2021/0167135 A1 Jun. 3, 2021

(30) Foreign Application Priority Data

Nov. 28, 2019 (KR) .................. 10-2019-0155343

(51) Int. Cl.
*G06K 9/00* (2006.01)
*H01L 27/32* (2006.01)
*G06F 3/044* (2006.01)
*G06V 40/13* (2022.01)

(52) U.S. Cl.
CPC .......... *H01L 27/323* (2013.01); *G06F 3/0443* (2019.05); *G06V 40/13* (2022.01); *G06V 40/1306* (2022.01); *G06V 40/1312* (2022.01); *H01L 27/3276* (2013.01)

(58) Field of Classification Search
CPC . H01L 27/323; H01L 27/3276; G06K 9/0002; G06K 9/036; G06K 9/00046; G06K 9/00013; G06F 3/0443
See application file for complete search history.

(56) References Cited

U.S. PATENT DOCUMENTS

| | | |
|---|---|---|
| 9,600,707 B1 | 3/2017 | Ramberg et al. |
| 2017/0147865 A1* | 5/2017 | Jensen ............... G06K 9/00046 |
| 2018/0121702 A1* | 5/2018 | Kim ...................... G06K 9/036 |
| 2019/0034688 A1* | 1/2019 | Lee ....................... G06F 3/0443 |
| 2019/0138123 A1 | 5/2019 | Jung et al. |

FOREIGN PATENT DOCUMENTS

| | | |
|---|---|---|
| KR | 10-2018-0088804 | 8/2018 |
| KR | 10-1936032 | 1/2019 |
| KR | 10-2019-0081730 | 7/2019 |

* cited by examiner

*Primary Examiner* — Abdul-Samad A Adediran
(74) *Attorney, Agent, or Firm* — H.C. Park & Associates, PLC

(57) ABSTRACT

A display device includes a display unit displaying an image, a fingerprint sensing unit disposed on one surface of the display unit and including fingerprint sensing pixels to sense a fingerprint, and a readout circuit providing a selection signal to the fingerprint sensing unit to select a predetermined amount of fingerprint sensing pixels from the fingerprint sensing pixels as a sensing area and receiving a fingerprint sensing signal from the sensing area. The readout circuit accumulates the fingerprint sensing signal provided from the fingerprint sensing pixels in the sensing area during a test mode and calculates a compensation value based on a difference between the accumulated fingerprint sensing signal and a reference value.

18 Claims, 24 Drawing Sheets

FIG. 15A

|  | 1 | 2 | 3 | ... | 254 | 255 | 256 |
|---|---|---|---|---|---|---|---|
| 1 | 1427 | 1461 | 1401 | ... | 1447 | 1351 | 1224 |
| 2 | 2021 | 2036 | 1928 | ... | 1901 | 1900 | 1667 |
| 3 | 1560 | 1576 | 1383 | ... | 1427 | 1400 | 1147 |
| ⋮ | ⋮ | ⋮ | ⋮ | ... | ⋮ | ⋮ | ⋮ |
| 254 | 1702 | 1740 | 1593 | ... | 1569 | 1640 | 1300 |
| 255 | 1182 | 1208 | 1173 | ... | 1207 | 1106 | 1005 |
| 256 | 1393 | 1418 | 1330 | ... | 1387 | 1265 | 1199 |

FIG. 15B

|  | 1 | 2 | 3 | ... | 254 | 255 | 256 |
|---|---|---|---|---|---|---|---|
| 1 | 3 | −31 | 29 | ... | −17 | 79 | 206 |
| 2 | −591 | −606 | −498 | ... | −471 | −470 | −237 |
| 3 | −130 | −146 | 47 | ... | 3 | 30 | 283 |
| ⋮ | ⋮ | ⋮ | ⋮ | ... | ⋮ | ⋮ | ⋮ |
| 254 | −272 | −310 | −163 | ... | −139 | −210 | 130 |
| 255 | 248 | 222 | 257 | ... | 223 | 324 | 425 |
| 256 | 37 | 12 | 100 | ... | 43 | 165 | 231 |

FIG. 15C

|  | 1 | 2 | 3 | ... | 254 | 255 | 256 |
|---|---|---|---|---|---|---|---|
| 1 | 1430 | 1430 | 1430 | ... | 1430 | 1430 | 1430 |
| 2 | 1430 | 1430 | 1430 | ... | 1430 | 1430 | 1430 |
| 3 | 1430 | 1430 | 1430 | ... | 1430 | 1430 | 1430 |
| ⋮ | ⋮ | ⋮ | ⋮ | ... | ⋮ | ⋮ | ⋮ |
| 254 | 1430 | 1430 | 1430 | ... | 1430 | 1430 | 1430 |
| 255 | 1430 | 1430 | 1430 | ... | 1430 | 1430 | 1430 |
| 256 | 1430 | 1430 | 1430 | ... | 1430 | 1430 | 1430 |

DISPLAY DEVICE HAVING FINGERPRINT SENSING FUNCTION AND METHOD OF OPERATING THE SAME

CROSS REFERENCE TO RELATED APPLICATION

This application claims priority from and the benefit of Korean Patent Application No. 10-2019-0155343, filed on Nov. 28, 2019, which is hereby incorporated by reference for all purposes as if fully set forth herein.

BACKGROUND

Field

Exemplary embodiments the invention relate generally to a display device, and more specifically, to the display device having a fingerprint sensing function.

Discussion of the Background

Multimedia electronic apparatuses, such as televisions, mobile phones, tablet computers, navigation units, and game units, include a display device to display an image. The electronic apparatus includes a display device that provides a touch-based input method allowing a user to easily and intuitively input information or commands in addition to the usual input methods, such as a button, a keyboard, a mouse, etc.

In recent years, as a user authentication method for online banking, product purchases, and security, a method of using a fingerprint, which is biometric information, is being proposed, and demands for a touch display device having a fingerprint recognition function is increasing.

Meanwhile, fingerprint recognition performance can be degraded due to deviation in the production process of the display device or deterioration of the characteristics of the components of the display device.

The above information disclosed in this Background section is only for understanding of the background of the inventive concepts, and, therefore, it may contain information that does not constitute prior art.

SUMMARY

One or more exemplary embodiments of the present invention provides a display device capable of sensing a fingerprint in a display area thereof.

One or more exemplary embodiments of the present invention provide a display device and a method of operating the display device, which are capable of compensating for a deviation between fingerprint sensors.

Additional features of the inventive concepts will beset forth in the description with follows, and in part will be apparent from the description, or may be learned by practice of the inventive concepts.

According to one or more exemplary embodiments of the invention, a display device includes a display unit displaying an image, a fingerprint sensing unit disposed on one surface of the display unit and including fingerprint sensing pixels to sense a fingerprint, and a readout circuit providing a block selection signal to the fingerprint sensing unit to select a predetermined amount of fingerprint sensing pixels from the fingerprint sensing pixels as a sensing area, and receiving a fingerprint sensing signal from the sensing area. The readout circuit accumulates the fingerprint sensing signal provided from the fingerprint sensing pixels in the sensing area during a test mode and calculates a compensation value based on a difference between the accumulated fingerprint sensing signal and a reference value.

According to one or more exemplary embodiments, the readout circuit may compensate for the fingerprint sensing signal provided from the fingerprint sensing pixels in the sensing area using the compensation value during a fingerprint sensing mode.

According to one or more exemplary embodiments, the readout circuit may further include a memory, and the readout circuit receives the fingerprint sensing signal from the fingerprint sensing pixels in the sensing area N (N is a natural number) times during the test mode and accumulates and stores the received fingerprint sensing signals in the memory.

According to one or more exemplary embodiments, the reference value may be an average value of the accumulated values of the fingerprint sensing signals of all fingerprint sensing pixels in the sensing area N times (where N is a natural number).

According to one or more exemplary embodiments, the readout circuit may perform the test mode when the display unit is in a non-operation state.

According to one or more exemplary embodiments, the fingerprint sensing unit may include a plurality of sensing units, each of the sensing units may include x by y fingerprint sensing pixels defined by x (where x is a natural number) fingerprint sensing pixels adjacent to each other in a first direction and y (where y is a natural number) fingerprint sensing pixels adjacent to each other in a second direction, and the sensing area includes at least one sensing unit among the sensing units.

According to one or more exemplary embodiments, each of the fingerprint sensing pixels may be connected to a plurality of fingerprint scan lines and a plurality of fingerprint sensing lines, and the fingerprint sensing unit may further include a fingerprint scan driving circuit that sequentially drives the fingerprint scan lines included in the sensing area among the fingerprint scan lines.

According to one or more exemplary embodiments, the fingerprint scan driving circuit may include a plurality of scan blocks respectively corresponding to the sensing units arranged in the second direction, and each of the scan blocks may sequentially drive the fingerprint scan lines in a corresponding sensing unit in response to the block selection signal.

According to one or more exemplary embodiments, the readout circuit may receive a fingerprint sensing signal from fingerprint sensing lines included in the sensing area among the fingerprint sensing lines.

According to one or more exemplary embodiments, the readout circuit may include a plurality of readout blocks respectively corresponding to the sensing units arranged in the first direction and a control circuit outputting a enable signal, and each of the readout blocks may receive the fingerprint sensing signal from the fingerprint sensing lines in the sensing units included in the sensing area among the sensing units in response to the enable signal.

According to one or more exemplary embodiments, the display unit may include a display area in which the pixels are arranged and a non-display area defined adjacent to the display area, and the fingerprint sensing pixels of the fingerprint sensing unit are arranged in a fingerprint sensing area corresponding to the display area.

According to one or more exemplary embodiments of the invention, a display device includes a display unit including a plurality of pixels, a panel driving circuit driving the display unit, a touch sensing unit disposed on the display unit to sense an external touch, a touch sensing circuit driving the touch sensing unit, a fingerprint sensing unit disposed on one surface of the display unit and including fingerprint sensing pixels to sense a fingerprint, and a readout circuit outputting a block selection signal to the fingerprint sensing unit to select a predetermined amount of fingerprint sensing pixels from the fingerprint sensing pixels as a sensing area and receiving a fingerprint sensing signal from the sensing area. The panel driving circuit controls the readout circuit to be operated in a test mode when the display unit is in a non-operation state, and the readout circuit accumulates the fingerprint sensing signal provided from the fingerprint sensing pixels in the sensing area during the test mode and calculates a compensation value based on a difference between the accumulated fingerprint sensing signal and a reference value.

According to one or more exemplary embodiments, the readout circuit may compensate for the fingerprint sensing signal provided from the fingerprint sensing pixels in the sensing area using the compensation value during a fingerprint sensing mode.

According to one or more exemplary embodiments, the readout circuit may further include a memory, and the readout circuit receives the fingerprint sensing signal from the fingerprint sensing pixels in the sensing area N (where N is a natural number) times during the test mode and accumulates and stores the received fingerprint sensing signals in the memory.

According to one or more exemplary embodiments, the reference value may be an average value of the accumulated values of the fingerprint sensing signals of all fingerprint sensing pixels in the sensing area N times (where N is a natural number).

According to one or more exemplary embodiments, the panel driving circuit controls the display unit such that a brightness of a light emitting area of the display unit may be at a predetermined level when receiving a touch sensing signal corresponding to an arbitrary touch area from the touch sensing circuit and controls the readout circuit to sense a fingerprint from the sensing area of the fingerprint sensing unit, and the touch area, the light emitting area, and the sensing area correspond to each other.

According to one or more exemplary embodiments of the invention, a method of operating a display device includes a display unit displaying an image and a fingerprint sensing unit including fingerprint sensing pixels to sense a fingerprint. The method includes starting a test mode, receiving a fingerprint sensing signal from the fingerprint sensing pixels, accumulating and storing the received fingerprint sensing signal, and calculating a compensation value based on a difference between the accumulated fingerprint sensing signal and a reference value.

According to one or more exemplary embodiments, the reference value may be an average value of the accumulated values of the fingerprint sensing signals of the fingerprint sensing pixels N times (where N is a natural number).

According to one or more exemplary embodiments, the starting of the test mode may be performed when the display unit is in a non-operation state.

According to one or more exemplary embodiments, the method may further include starting a fingerprint sensing mode when a user input is received and compensating for the fingerprint sensing signal provided from the fingerprint sensing pixels in the sensing area using the compensation value.

According to the above, the display device may sense the fingerprint in the display area. In addition, the display device may sense a characteristic distribution of the fingerprint sensors in the test mode and may calculate the compensation values respectively corresponding to the fingerprint sensors based on the sensed characteristic distribution. The display device may add the compensation value to fingerprint information sensed in the fingerprint sensing mode to obtain corrected fingerprint information. Accordingly, the display device may compensate for a deviation between the fingerprint sensors.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

FIG. 15A is a view showing an accumulated value of fingerprint sensing signals received from a sensing area of a fingerprint sensing unit in a test mode;

FIG. 15B is a view showing a compensation value calculated in the test mode.

FIG. 15C is a view showing a result obtained by adding the compensation value to the accumulated value of the fingerprint sensing signal in the test mode.

DETAILED DESCRIPTION

Figure 1:
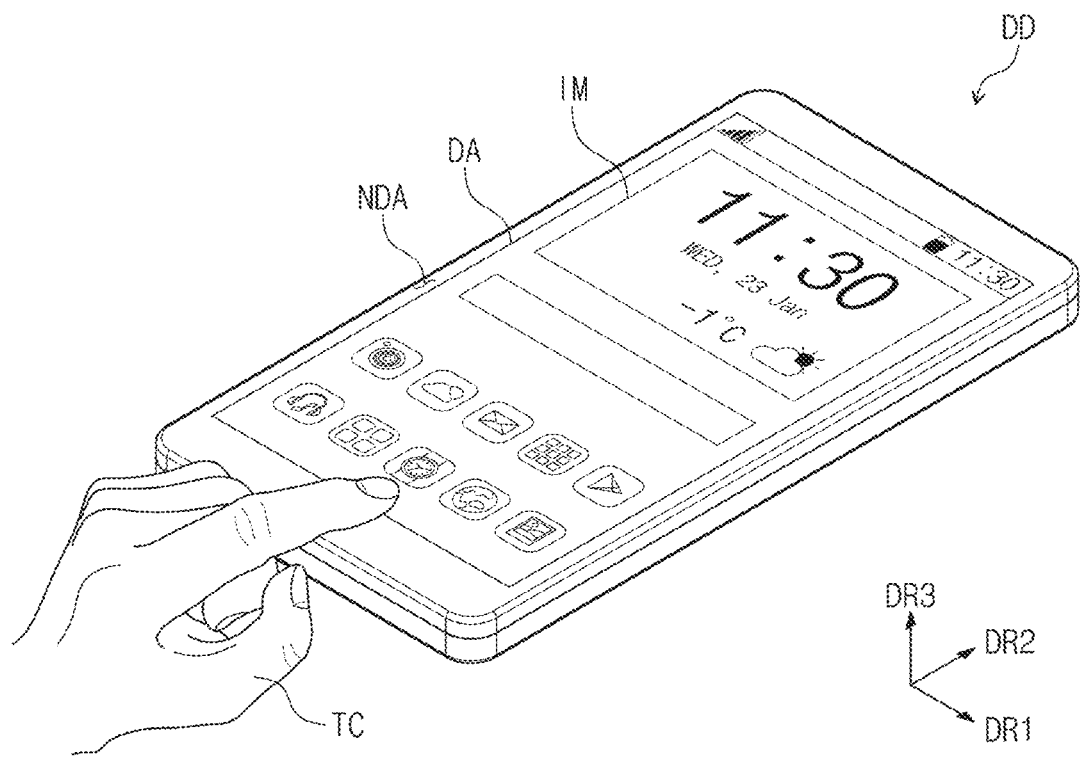
FIG. 1 is a perspective view showing a display device according to an embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, is and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present disclosure will be explained in detail with reference to the accompanying drawings.

Figure 2A:
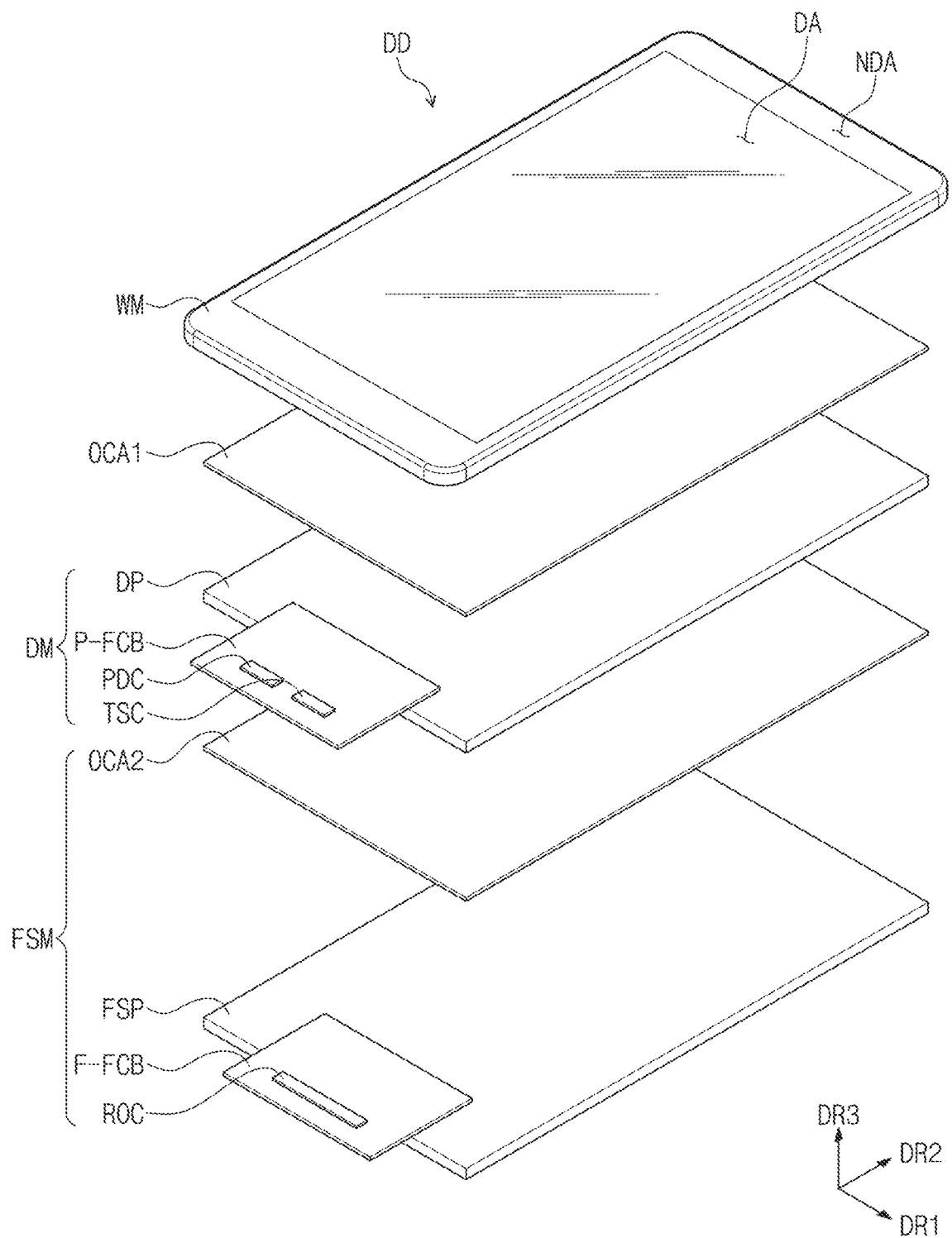
FIG. 2A is an exploded perspective view showing a display device according to an embodiment of the inventive concepts.
Figure 2B:
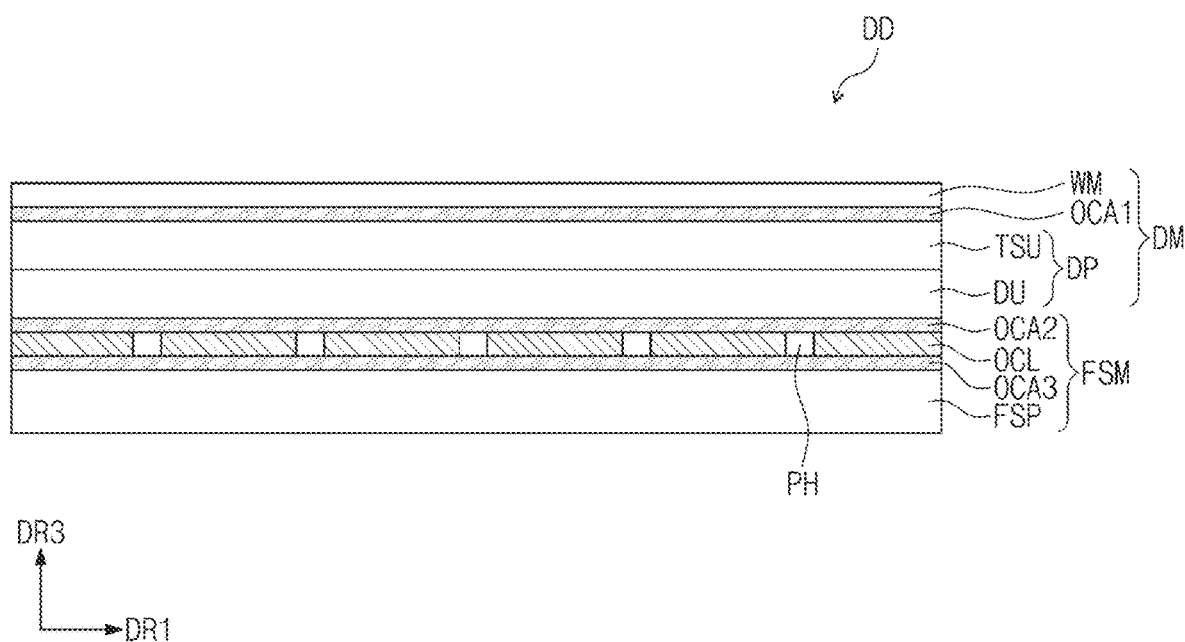
FIG. 2B is a cross-sectional view showing a display device according to an embodiment of the inventive concepts.

FIG. 1 is a perspective view showing a display device according to an exemplary embodiment of the present disclosure. FIG. 2A is an exploded perspective view showing a display device according to an exemplary embodiment of the present disclosure. FIG. 2B is a cross-sectional view showing a display device according to an exemplary embodiment of the present disclosure. In FIGS. 2A and 2B, components of the display device DD are simply illustrated to show a stacking relationship therebetween.

FIG. 1 shows a mobile terminal as a representative example of the display device DD according to the exemplary embodiment of the present disclosure. The mobile terminal may include a tablet PC, a smartphone, a personal digital assistants (PDA), a portable multimedia player (PMP), a game unit, a wrist-type electronic device, or the like, however, it should not be limited thereto or thereby.

The display device DD of the present disclosure may be applied to a large-sized electronic item, such as a television set or an outdoor billboard, and a small and medium-sized electronic item, such as a personal computer, a notebook computer, a car navigation unit, and a camera. These are merely exemplary, and thus, the display device DD may be applied to other electronic devices as long as they do not depart from the concept of the present disclosure.

As shown in FIG. 1, a display surface through which an image IM is displayed may be substantially parallel to a plane defined by a first direction DR1 and a second direction DR2. The display device DD may include a plurality of areas distinguished from each other on the display surface. The display surface may include a display area DA through which the image IM is displayed and a non-display area NDA defined adjacent to the display area DA. The non-display area NDA may be called a bezel area. As an example, the display area DA may have a quadrangular shape. The non-display area NDA may surround the display area DA. In addition, although not shown in figures, the display device DD may have a shape that is partially curved. In this case, a portion of the display area DA may have a curved shape.

Front (or upper, or first) and rear (or lower, or second) surfaces of each member of the display device DD are defined with respect to a direction in which the image IM is displayed. However, directions indicated by the first, second, and third directions DR1, DR2, and DR3 are relative to each other, and thus, the directions indicated by the first, second, and third directions DR1, DR2, and DR3 may be changed to other directions.

The display device DD according to an exemplary embodiment of the present disclosure may sense a user input TC applied from the outside. The user input TC may include various types of external inputs, such as a touch by a portion of user's body, light, heat, or pressure. In the present exemplary embodiment, it is assumed that the user input TC is a touch input applied to a front surface of the display device DD by a user's hand, however, this is exemplary. As described above, the user input TC may be provided in various forms. In addition, the display device DD may sense the user input applied to a side surface of a rear surface of the display device DD depending on its structure, however, it should not be particularly limited.

Referring to FIG. 2A, the display device DD may include a window member WM, a first adhesive member OCA1, a display module DM, and a fingerprint sensing module FSM. The display module DM may include a display panel DP, a panel circuit board P-FCB, a panel driving circuit PDC, and a touch sensing circuit TSC.

The window member WM may provide the front surface of the display device DD shown in FIG. 1. The window member WM may include a glass substrate, a sapphire substrate, or a plastic substrate. In addition, the window member WM may include a functional coating layer, such as an anti-fingerprint layer, an anti-reflective layer, and a hard coating layer. As an example, the window member WM has a flat shape in the display area DA, however, the shape of the window member WM may be changed. Edges of the window member WM, which face each other in the first direction DR1, may have a curved surface.

The display panel DP may be disposed on a rear surface of the window member WM and may generate the image. The display panel DP may sense the user input TC (refer to FIG. 1), e.g., an input caused by a touch and/or a pressure generated by the user. In the present exemplary embodiment, the display panel DP has the flat display surface as a representative example, however, the shape of the display panel DP may be changed. Edges of the display panel DP, which face each other in the first direction DR1, may be bent to provide a curved surface.

The display panel DP may include a variety of display elements. For example, the display element may be a liquid crystal capacitor, an organic light emitting element, an electrophoretic element, or an electrowetting element. The display element according to an exemplary embodiment may include a plurality of organic light emitting diodes. That is, the display panel DP according to the present disclosure may be a flexible display panel, e.g., an organic light emitting display panel.

The first adhesive member OCA1 may be disposed between the window member WM and the display panel DP. The first adhesive member OCA1 may be an optically transparent adhesive member.

One end of the panel circuit board P-FCB may be bonded to pads arranged in an area of the display panel DP to be electrically connected to the display panel DP. According to an exemplary embodiment, each of the panel driving circuit PDC and the touch sensing circuit TSC may be mounted on the panel circuit board P-FCB in a chip-on-film (COF) manner. Although not shown separately, a plurality of passive elements and a plurality of active elements may be further mounted on the panel circuit board P-FCB. The panel circuit board P-FCB may apply electrical signals to the display panel DP via signal lines. The panel circuit board P-FCB may be implemented in a flexible printed circuit board. The other end of the panel circuit board P-FCB may be electrically connected to other components of the display device DD (refer to FIG. 1).

The fingerprint sensing module FSM may be disposed on a rear surface of the display panel DP and may include a second adhesive member OCA2, an optical layer OCL, a third adhesive member OCA3, a fingerprint sensing panel FSP, a fingerprint circuit is board F-FCB, and a readout circuit ROC. In the present exemplary embodiment, the fingerprint sensing module FSM is disposed on the rear surface of the display panel DP, however, the present disclosure should not be limited thereto or thereby. For example, the fingerprint sensing module FSM may be disposed on an upper surface of the display panel DP.

The second adhesive member OCA2 may be disposed between the display panel DP and the optical layer OCL to combine the display panel DP and the optical layer OCL. The third adhesive member OCA3 may be disposed between the optical layer OCL and the fingerprint sensing panel FSP to combine the optical layer OCL and the fingerprint sensing panel FSP. Each of the second adhesive member OCA2 and the third adhesive member OCA3 may be, but not limited to, an optically transparent adhesive member.

The optical layer OCL may include a plurality of pin holes PH defined therethrough to transmit a light reflected by a fingerprint of the user input TC (refer to FIG. 1).

In FIG. 2B, the second adhesive member OCA2 and the optical layer OCL are included in the fingerprint sensing module FSM, however, the present disclosure should not be limited thereto or thereby. According to another embodiment, the second adhesive member OCA2 and the optical layer OCL may be included in the display module DM.

The fingerprint sensing panel FSP may sense an amount of light, which exits from the display panel DP, is emitted to the outside through the window member WM, and is reflected by the user input TC, to sense fingerprint information of the user. The light reflected by the user input TC may be provided to the fingerprint sensing panel FSP through the pin holes PH of the optical layer OCL. Areas in which the pin holes PH are not formed in the optical layer OCL may be implemented with an opaque material to block the light. In addition, the optical layer OCL may be implemented with a material having a small reflectance.

One end of the fingerprint circuit board F-FCB may be bonded to pads arranged in an area of the fingerprint sensing panel FSP and may be electrically connected to the fingerprint sensing panel FSP. According to an exemplary embodiment, the readout circuit ROC may be mounted on the fingerprint circuit board F-FCB in a chip-on-film (COF) manner. Although not shown separately, a plurality of passive elements and a plurality of active elements may be further mounted on the fingerprint circuit board F-FCB. The fingerprint circuit board F-FCB may apply electrical signals to the fingerprint sensing panel FSP via signal lines and may receive a fingerprint sensing signal from the fingerprint sensing panel FSP. The fingerprint circuit board F-FCB may be implemented in a flexible printed circuit board. The other end of the fingerprint circuit board F-FCB may be electrically connected to other components of the display device DD.

In the present exemplary embodiment, the panel circuit board P-FCB and the fingerprint circuit board F-FCB may be disposed respectively at one ends of the display panel DP and the fingerprint sensing panel FSP to face each other, however, the present disclosure should not be limited thereto or thereby. As another exemplary embodiment, the panel circuit board P-FCB and the fingerprint circuit board F-FCB may be disposed to be spaced apart from each other in the second direction DR2. That is, the panel circuit board P-FCB may be connected to one side of the display panel DP, and the fingerprint circuit board F-FCB may be connected to the other side of the fingerprint sensing panel FSP, which corresponds to the other side of the display panel DP.

The display device DD shown in FIG. 2A may further include a variety of elements in addition to the display module DM and the fingerprint sensing module FSM to control an operation of the display module DM and the fingerprint sensing module FSM. Circuit elements of the display device DD will be described later in detail with reference to FIG. 2C.

Referring to FIG. 2B, the display device DD may include the display module DM and the fingerprint sensing module FSM. The display module DM may include the window member WM, the first adhesive member OCA1, and the display panel DP. The display panel DP may include a touch sensing unit TSU and a display unit DU. According to another embodiment, a stacking order of the touch sensing unit TSU and the display unit DU may be changed. According to another embodiment, the window member WM may include an anti-reflective layer and a window layer.

The fingerprint sensing module FSM may include the second adhesive member OCA2 and the fingerprint sensing panel FSP. In the exemplary embodiment, the fingerprint sensing module FSM is disposed on the rear surface of the display panel DP, however, the present disclosure should not be limited thereto or thereby. For example, the fingerprint sensing module FSM may be disposed on the upper surface of the display panel DP.

Figure 2C:
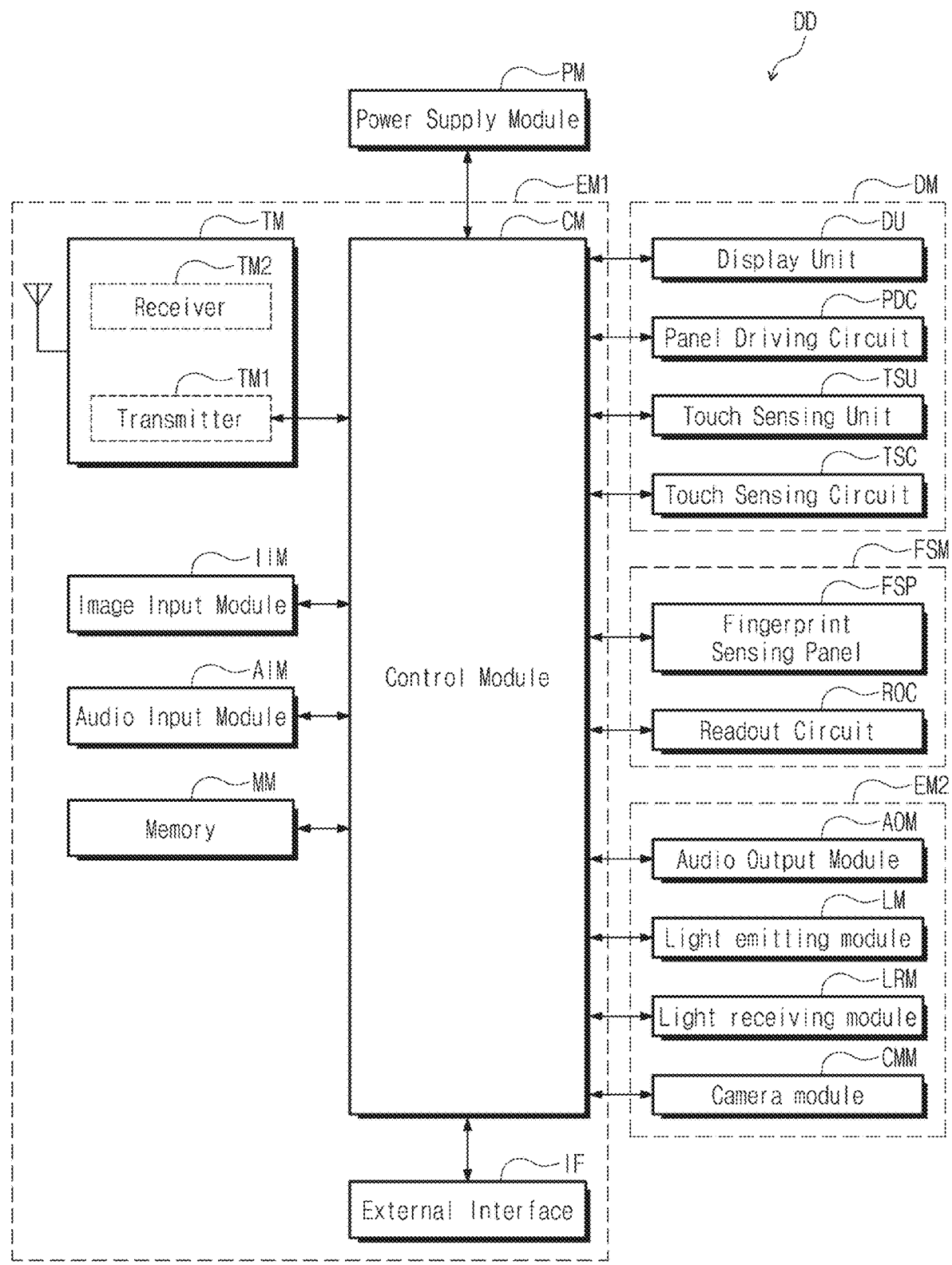
FIG. 2C is a block diagram showing a display device according to an embodiment of the inventive concepts.

FIG. 2C is a block diagram showing the display device DD shown in FIG. 1.

Referring to FIG. 2C, the display device DD may include the display module DM, a power supply module PM, a first electronic module EM1, a second electronic module EM2, and the fingerprint sensing module FSM. The display module DM, the power supply module PM, the first electronic module EM1, the second electronic module EM2, and the fingerprint sensing module FSM may be electrically connected to each other. FIG. 2C shows the display unit DU, the panel driving circuit PDC, the touch sensing unit TSU, and the touch sensing circuit TSC of the display module DM as a representative example. In addition, FIG. 2C shows the fingerprint sensing panel FSP and the readout circuit ROC of the fingerprint sensing module FSM as a representative example.

The power supply module PM supplies a power source necessary for an overall operation of the display device DD. The power supply module PM may include a normal battery module.

The first electronic module EM1 and the second electronic module EM2 may include a variety of functional modules to drive the display device DD. The first electronic module EM1 may be mounted directly on a mother board electrically connected to the display module DM or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the display device DD. The control module CM may be, but not limited to, a microprocessor. For example, the control module CM may activate or deactivate the display module DM. The control module CM may control other modules, such as the image input module IIM or the audio input module AIM, based on the touch signal provided from the display module DM. The control module CM may perform a user authentication based on a fingerprint signal provided from the fingerprint sensing module FSM.

The wireless communication module TM may transmit/receive a wireless signal to/from other terminals using a Bluetooth or WiFi link. The wireless communication module TM may transmit and receive a voice signal using a general communication line. The wireless communication module TM may include a transmitter TM1 that modulates a signal to be transmitted and transmits the modulated signal and a receiver TM2 that demodulates a signal applied thereto.

The image input module IIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket (e.g., a memory card and a SIM/UIM card), etc.

The second electronic module EM2 may include an audio output module AOM, a light emitting module LM, a light receiving module LRM, and a camera module CMM. The modules may be mounted directly on the mother board, may be electrically connected to the display module DM through a connector (not shown) after being mounted on a separate substrate, or may be electrically connected to the first electronic module EM1.

The audio output module AOM may convert audio data provided from the wireless communication module TM or audio data stored in the memory MM and may output the converted audio data to the outside.

The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor. The infrared ray generated by and output from the light emitting module LM may be reflected by an external object, e.g., a user's finger or face, and the reflected infrared ray may be incident into the light receiving module LRM. The camera module CMM takes an image of an external object.

Figure 3A:
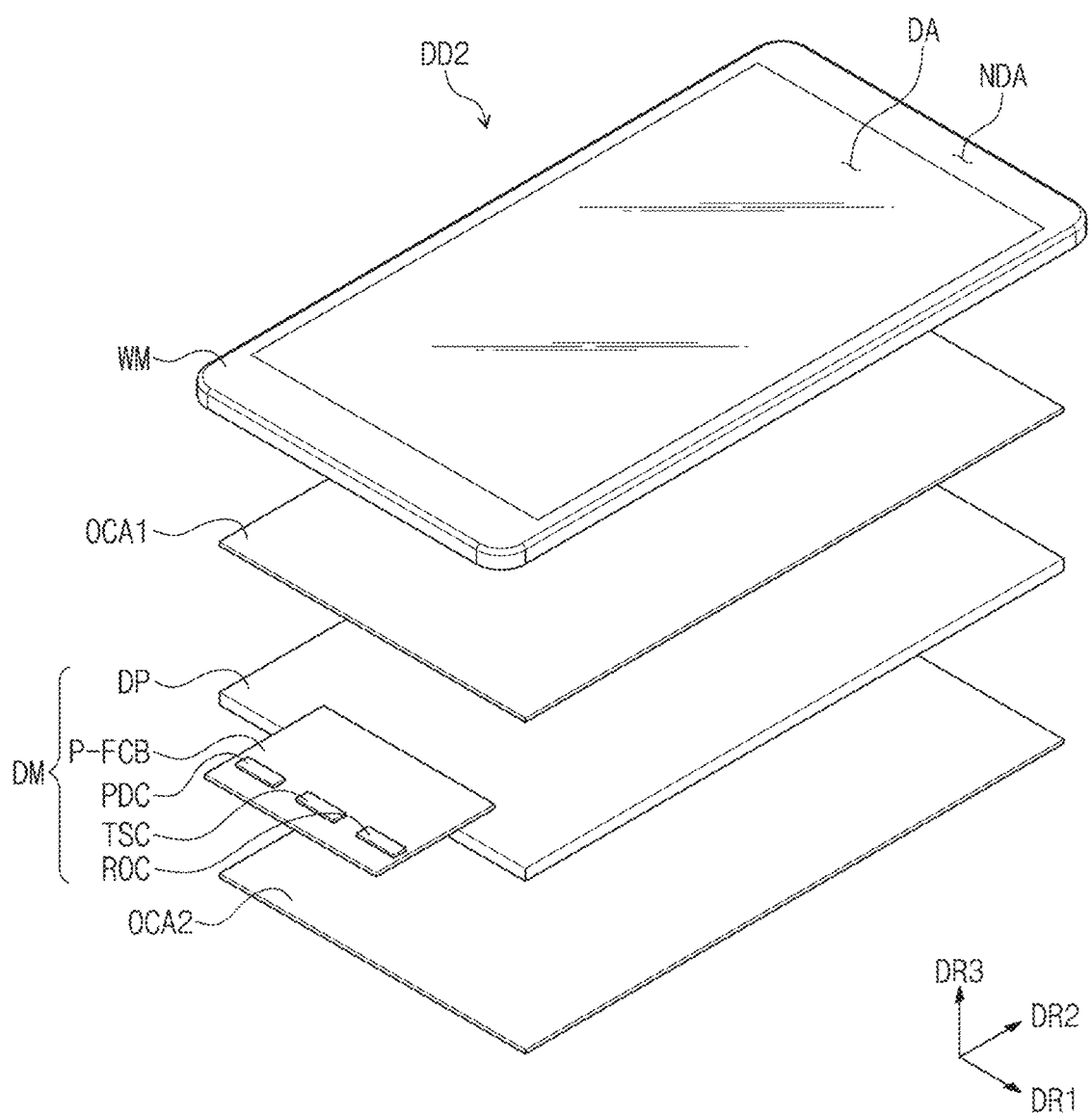
FIG. 3A is an exploded perspective view showing a display device according to an embodiment of the inventive concepts.
Figure 3B:
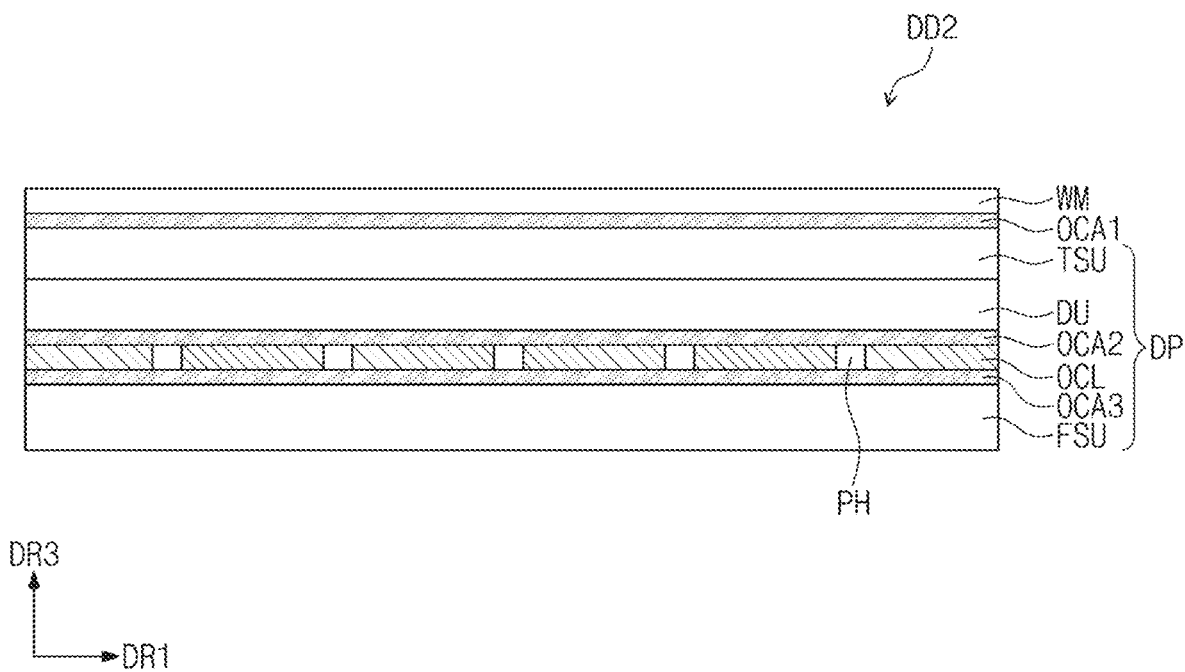
FIG. 3B is a cross-sectional view showing a display device according to an embodiment of the inventive concepts.

FIG. 3A is an exploded perspective view showing a display device DD2 according to an exemplary embodiment of the present disclosure. FIG. 3B is a cross-sectional view showing the display device DD2 according to an exemplary embodiment of the present disclosure. In FIGS. 3A and 3B, the same reference numerals denote the same elements in FIGS. 2A and 2B, and thus, detailed descriptions of the same elements will be omitted.

Referring to FIGS. 3A and 3B, the display device DD2 may include a window member WM, a first adhesive member OCA1, and a display module DM. The display module DM may include a display panel DP, a panel circuit board P-FCB, a panel driving circuit PDC, a touch sensing circuit TSC, and a readout circuit ROC.

The window member WM may provide the front surface of the display device DD shown in FIG. 1. The first adhesive member OCA1 may be disposed between the window member WM and the display panel DP. The first adhesive member OCA1 may be, but not limited to, an optically transparent adhesive member.

The display panel DP may be disposed on a rear surface of the window member WM and may generate an image. The display panel DP may include a touch sensing unit TSU, a display unit DU, an optical layer OCL, and a fingerprint sensing unit FSU.

A second adhesive member OCA2 may be disposed between the display unit DU and the optical layer OCL and may combine the display unit DU and the optical layer OCL. A third adhesive member OCA3 may be disposed between the optical layer OCL and the fingerprint sensing unit FSU and may combine the optical layer OCL and the fingerprint sensing unit FSU. Each of the second adhesive member OCA2 and the third adhesive member OCA3 may be an optically transparent adhesive member.

In the present exemplary embodiment, the window member WM may be a panel-type component, and each of the touch sensing unit TSU, the display unit DU, the optical layer OCL, and the fingerprint sensing unit FSU is a layer-type component. The panel-type component may include a base layer that provides a base surface, e.g., a synthetic resin film, a composite material film, or a glass substrate, however, the base layer may be omitted in the layer-type component. In other words, layer-type components may be disposed on the base surface provided by other components. In an exemplary embodiment of the present disclosure, the window member WM may be the layer-type component.

Figure 3C:
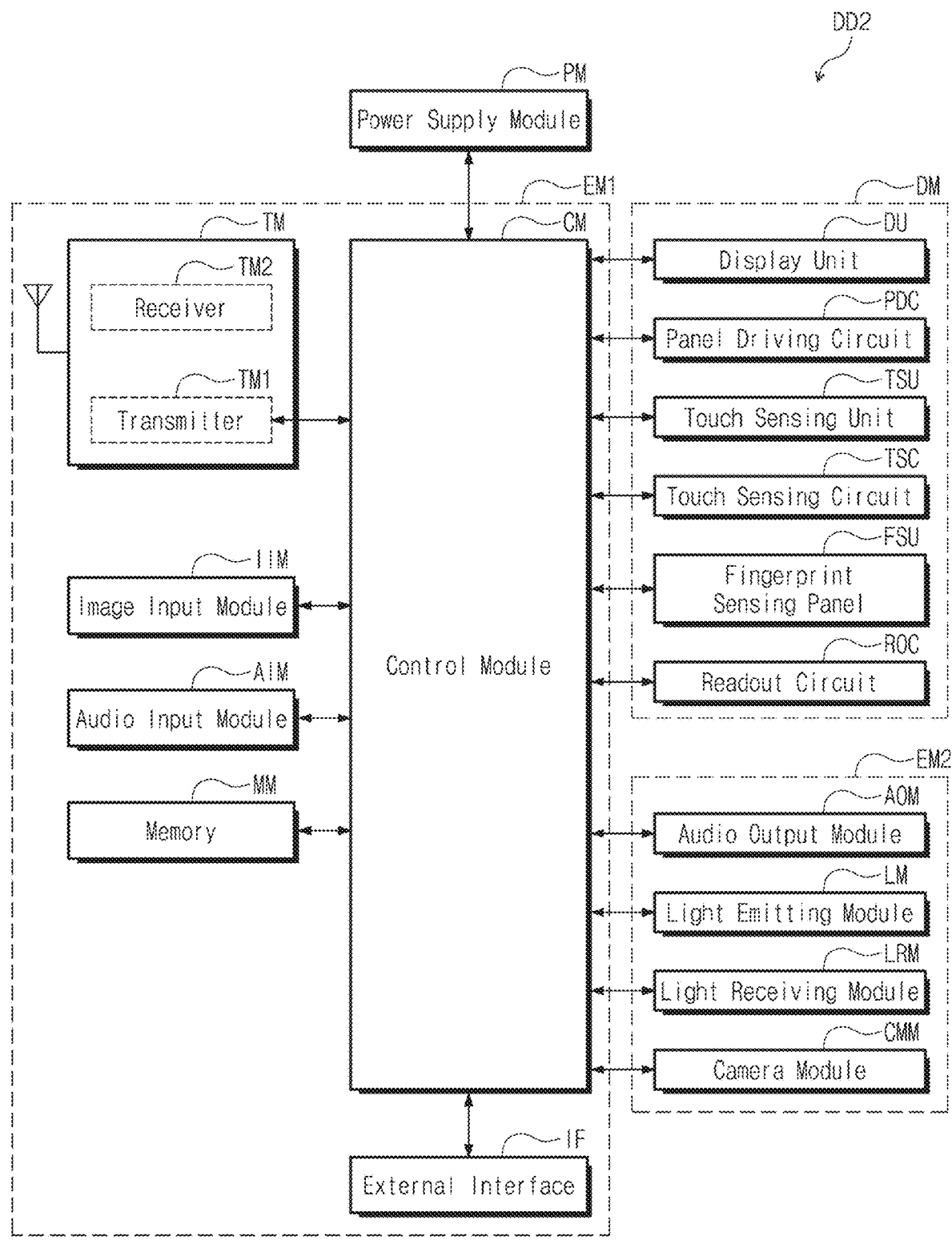
FIG. 3C is a block diagram showing a display device according to an embodiment of the inventive concepts.

FIG. 3C is a block diagram showing the display device DD2 according to an exemplary embodiment of the present disclosure.

In FIG. 3C, the same reference numerals denote the same elements in the display device DD shown in FIG. 2C, and thus, detailed descriptions of the same elements will be omitted.

Referring to FIG. 3C, the display module DM may include the display unit DU, the panel driving circuit PDC, the touch sensing unit TSU, the touch sensing circuit TSC, the fingerprint sensing unit FSU, and the readout circuit ROC. Detailed operations of the components of the display module DM will be described in detail below.

Figure 4:
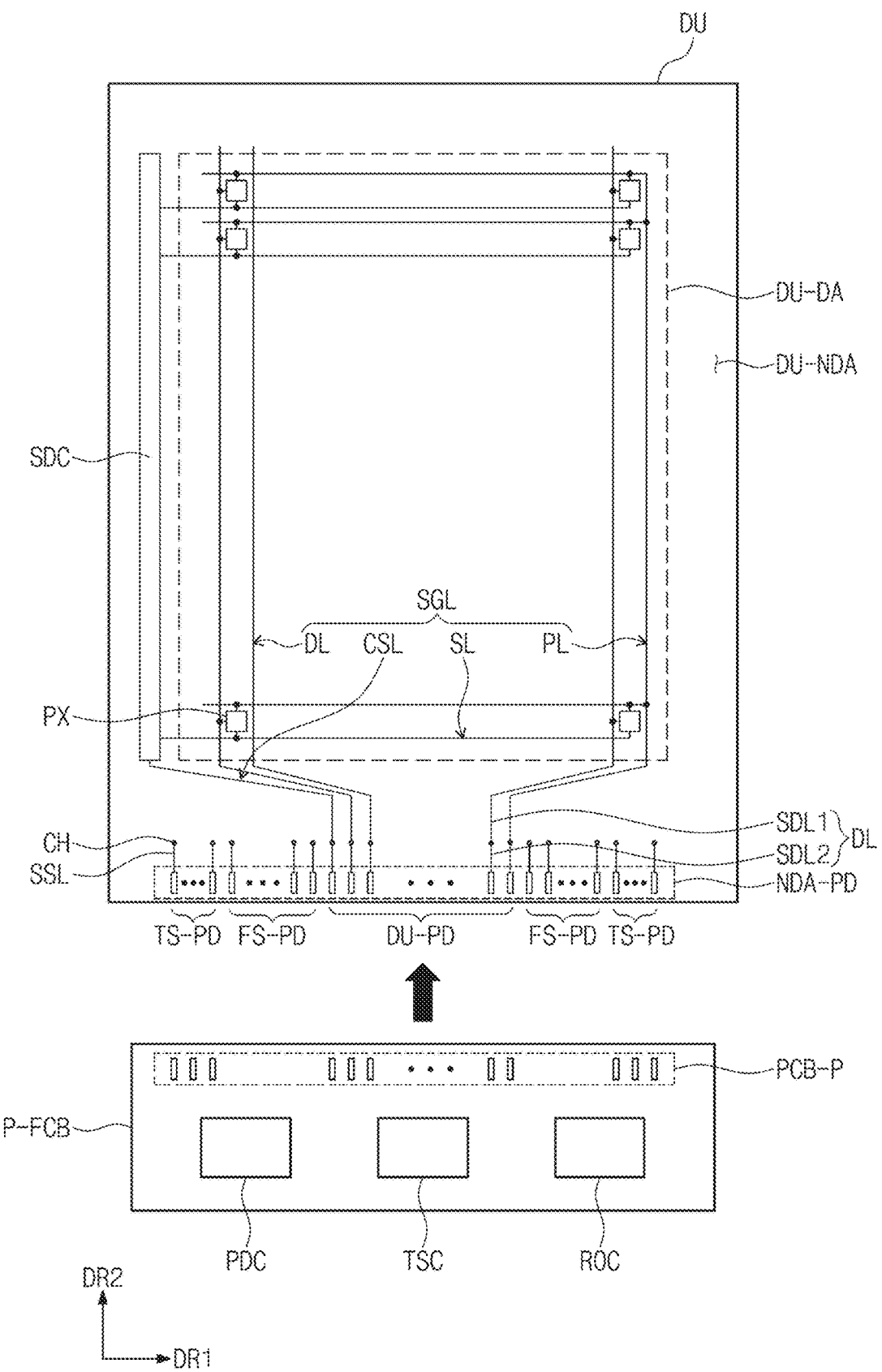
FIG. 4 is a plan view showing a display unit according to an embodiment of the inventive concepts.

FIG. 4 is a plan view showing the display unit DU according to an exemplary embodiment of the present disclosure. FIG. 4 schematically shows a signal circuit diagram. In addition, for the convenience of explanation, some components are omitted in FIG. 4.

As shown in FIG. 4, the display unit DU may include a display area DU-DA and a non-display area DU-NDA. In the present exemplary embodiment, the non-display area DU-NDA may be defined along an edge of the display area DU-DA. The display area DU-DA and the non-display area DU-NDA of the display unit DU may respectively correspond to the display area DA and the non-display area NDA of the display device DD shown in FIG. 1.

The display unit DU may include a scan driving circuit SDC, a plurality of signal lines SGL, a plurality of signal pads DU-PD, TS-PD, and FS-PD, and a plurality of pixels PX. The pixels PX may be arranged in the display area DU-DA. Each of the pixels PX may include an organic light emitting diode and a pixel driving circuit connected to the organic light emitting diode.

The scan driving circuit SDC may generate a plurality of scan signals and may sequentially output the scan signals to a plurality of scan lines SL described later. The scan driving circuit SDC may further output other control signals to the pixel driving circuit of the pixels PX.

The scan driving circuit SDC may include a plurality of thin film transistors formed through the same processes, e.g., a low temperature polycrystalline silicon (LTPS) process or a low temperature polycrystalline oxide (LTPO) process, as the pixel driving circuit of the pixels PX.

The signal lines SGL may include the scan lines SL, data lines DL, a power line PL, and a control signal line CSL.

Each of the scan lines SL may be connected to a corresponding pixel among the pixels PX, and each of the data lines DL may be connected to a corresponding pixel among the pixels PX. The power line PL may be connected to the pixels PX. The control signal line CSL may provide control signals to the scan driving circuit SDC.

The signal lines SGL may overlap the display area DU-DA and the non-display area DU-NDA. The signal lines SGL may include a pad part and a line part. The line part may overlap the display area DU-DA and the non-display area DU-NDA. The pad part may be connected to an end of the line part. The pad part may be disposed in the non-display area DU-NDA and may overlap a corresponding signal pad among the signal pads DU-PD, TS-PD, and FS-PD. An area in which the signal pads DU-PD, TS-PD, and FS-PD are arranged in the non-display area DU-NDA may be referred to as a "pad area NDA-PD".

In the present exemplary embodiment, the signal lines SGL may further include auxiliary lines SSL. The auxiliary lines SSL are signal lines connected to the touch sensing unit TSU (refer to FIG. 3B). In an exemplary embodiment of the present disclosure, the auxiliary lines SSL may be omitted.

The signal lines SGL may include a plurality of portions disposed on different layers from each other. FIG. 4 shows the data lines DL each including two portions SDL1 and SDL2 and the auxiliary lines SSL. The two portions SDL1 and SDL2 may be connected to each other through contact holes CH. The auxiliary lines SSL may be connected to a signal line of the touch sensing unit TSU (refer to FIG. 5) and a signal line of the fingerprint sensing unit FSU (refer to FIG. 6) via the contact holes CH.

The signal pads DU-PD, TS-PD, and FS-PD may include first-type signal pads DU-PD connected to the data lines DL, the power line PL, and the control signal line CSL and second-type signal pads TS-PD and third-type signal pads FS-PD, which are connected to the auxiliary lines SSL. The first-type signal pads DU-PD, the second-type signal pads TS-PD, and the third-type signal pads FS-PD may be disposed in the pad area NDA-PD defined in some areas of the non-display area DU-NDA to be adjacent to each other. The stacked structure or materials of the signal pads DP-PD, TS-PD, and FS-PD may not be distinguished from each other and may be formed through the same process.

The line part connected to the pixel PX may substantially form a great part of the signal lines SGL. The line part may be connected to the transistors (not shown) of the pixels PX. The line part may have a single-layer or multi-layer structure and may be formed in a single body or may include two or more portions. The two or more portions may be disposed on different layers and may be connected to each other through contact holes defined through an insulating layer disposed between the two or more portions.

In FIG. 4, the panel circuit board P-FCB electrically connected to the display unit DU is additionally shown. The panel circuit board P-FCB may be a rigid circuit board or a flexible circuit board. The panel circuit board P-FCB may be directly combined with the display unit DU or may be connected to the display unit DU through another circuit board.

The panel driving circuit PDC may be disposed on the panel circuit board P-FCB to control the operation of the display unit DU. In addition, the touch sensing circuit TSC that controls the touch sensing unit TSU may be disposed on the panel circuit board P-FCB. The readout circuit ROC that controls the fingerprint sensing unit FSU may be disposed on the panel circuit board P-FCB. Each of the panel driving circuit PDC, the touch sensing circuit TSC, and the readout circuit ROC may be mounted directly on the panel circuit board P-FCB in the form of an integrated chip. The panel circuit board P-FCB may include circuit board pads PCB-P electrically connected to the display unit DU. Although not shown in figures, the panel circuit board P-FCB may further include signal lines which connect the circuit board pads PCB-P to the panel driving circuit PDC and to the touch sensing circuit TSC and the readout circuit ROC.

Figure 5:
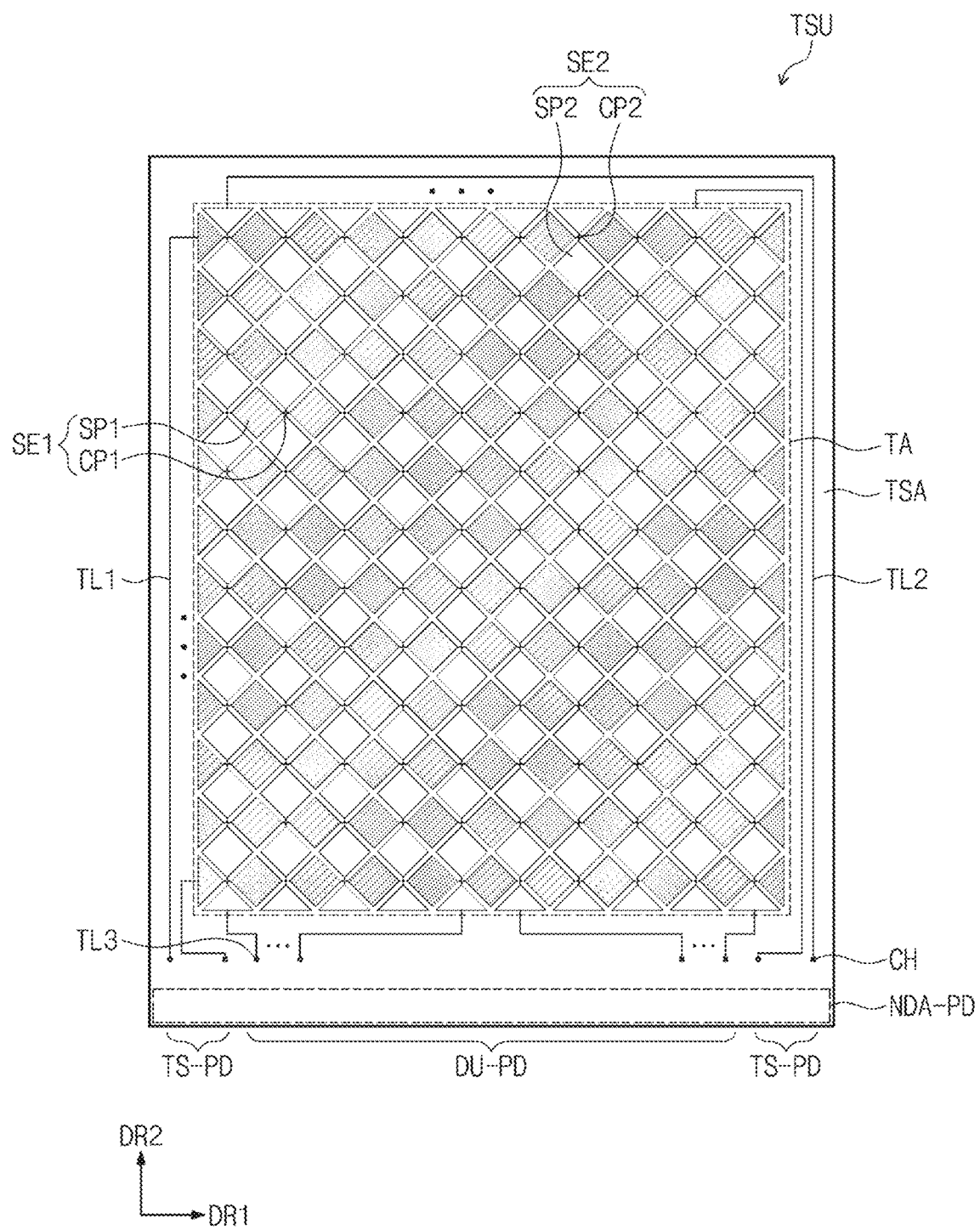
FIG. 5 is a plan view showing a touch sensing unit according to an embodiment of the inventive concepts.

FIG. 5 is a plan view showing the touch sensing unit TSU according to an exemplary embodiment of the present disclosure.

Referring to FIG. 5, the touch sensing unit TSU may be disposed on the display unit DU (refer to FIG. 4). The touch sensing unit TSU may sense the user input TC (refer to FIG. 1) and may obtain information about position and intensity of the external touch input. The touch sensing unit TSU may include a touch area TA and a touch peripheral area TSA in a plane. In the present exemplary embodiment, the touch peripheral area TSA may be defined along an edge of the touch area TA. The touch area TA and the touch peripheral area TSA of the touch sensing unit TSU may respectively correspond to the display area DA and the non-display area NDA of the display device DD shown in FIG. 1.

The touch sensing unit TSU may include a plurality of first sensing electrodes SE1, a plurality of second sensing electrodes SE2, and a plurality of sensing lines TL1, TL2, and TL3.

The first sensing electrodes SE1 and the second sensing electrodes SE2 may be arranged in the touch area TA. The touch sensing unit TSU may obtain information about the touch input depending on a variation in capacitance between the first sensing electrodes SE1 and the second sensing electrodes SE2.

The first sensing electrodes SE1 may extend in the first direction DR1 and may be arranged in the second direction DR2. The first sensing electrodes SE1 may include a plurality of first sensing patterns SP1 and a plurality of first connection patterns CP.

The first sensing patterns SP1 that form one first sensing electrode may be arranged in the first direction DR1 to be spaced apart from each other. For the convenience of explanation, the first sensing patterns SP1 are shown shaded. The first connection patterns CP1 may be disposed between the first sensing patterns SP1 and may connect two first sensing patterns SP1 adjacent to each other.

The second sensing electrodes SE2 may extend in the second direction DR2 and may be arranged in the first direction DR1. The second sensing electrodes SE2 may include a plurality of second sensing patterns SP2 and a plurality of second connection patterns CP2.

The second sensing patterns SP2 that form one second sensing electrode may be arranged in the second direction DR2 to be spaced apart from each other. The second connection patterns CP2 may be disposed between the second sensing patterns SP2 and may connect two second sensing patterns SP2 adjacent to each other.

The sensing lines TL1, TL2, and TL3 may be disposed in the touch peripheral area TSA. The sensing lines TL1, TL2, and TL3 may include first sensing lines TL1, second sensing lines TL2, and third sensing lines TL3. The first sensing lines TL1 may be respectively connected to the first sensing electrodes SE1. The second sensing lines TL2 may be respectively connected to one ends of the second sensing electrodes SE2. The third sensing lines TL3 may be respectively connected to the other ends of the second sensing electrodes SE2. The other ends of the second sensing electrodes SE2 may be portions opposite to the one ends of the second sensing electrodes SE2. Accordingly, it is possible to uniformly maintain a sensitivity with respect to areas of the second sensing electrode SE2 having a relatively longer length than that of the first sensing electrode SE1. According to another embodiment, one of the second sensing lines TL2 and the third sensing lines TL3 may be omitted. The first sensing lines TL1, the second sensing lines TL2, and the third sensing lines TL3 may be connected to a portion of the auxiliary lines SSL shown in FIG. 4 through contact holes CH. The first sensing lines TL1 and the second sensing lines TL2 may be electrically connected to the second-type signal pads TS-PD through the auxiliary lines SSL.

Figure 6:
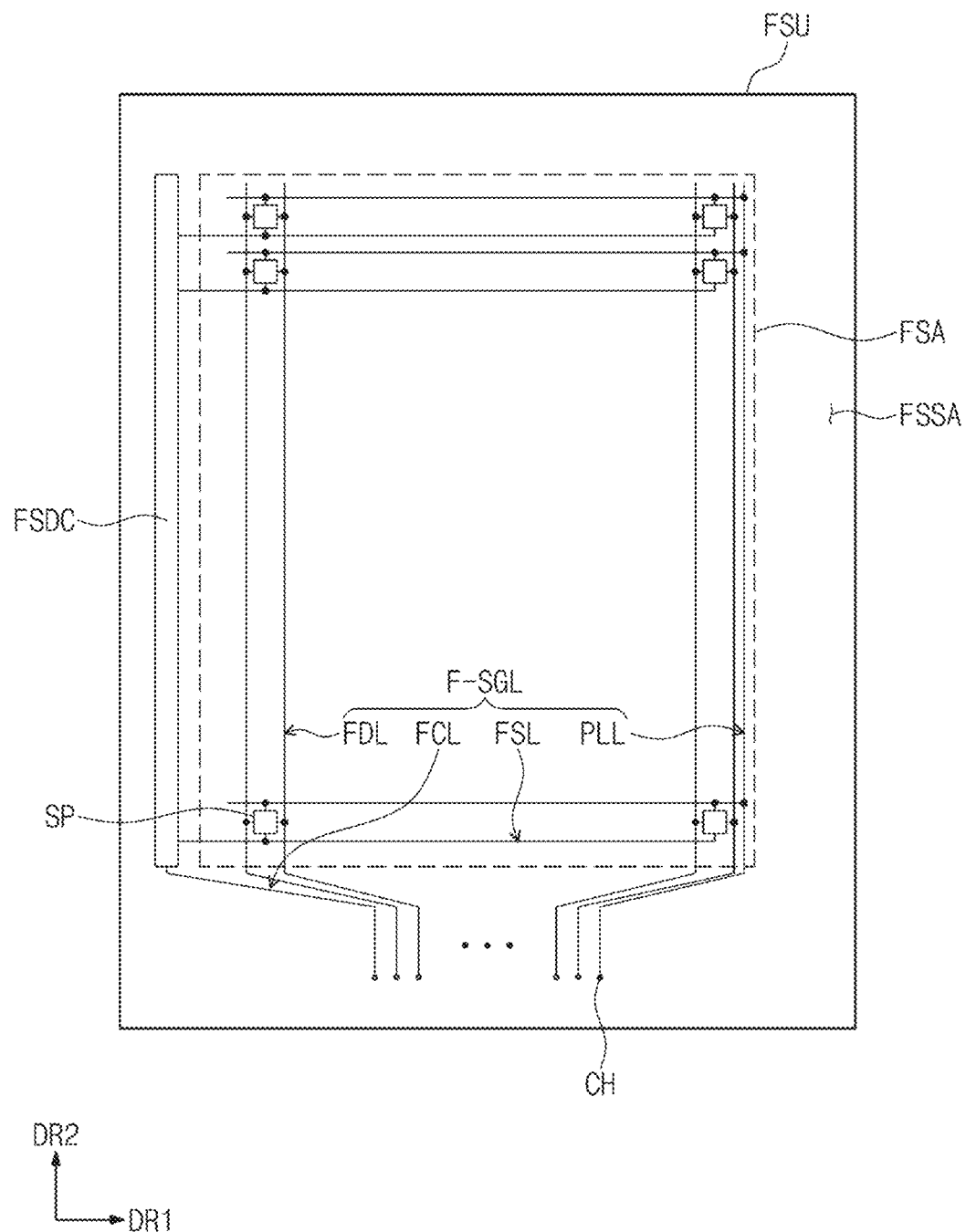
FIG. 6 is a plan view showing a fingerprint sensing unit according to an e embodiment of the inventive concepts.

FIG. 6 is a plan view showing the fingerprint sensing unit according to an exemplary embodiment of the present disclosure.

Referring to FIG. 6, the fingerprint sensing unit FSU may sense the light reflected by the user input TC (refer to FIG. 1) and may obtain user's fingerprint information. The fingerprint sensing unit FSU may include a fingerprint sensing area FSA and a peripheral area FSSA in a plan view. In the present exemplary embodiment, the peripheral area FSSA may be defined along an edge of the fingerprint sensing area FSA. The fingerprint sensing area FSA and the peripheral area FSSA of the fingerprint sensing unit FSU may respectively correspond to the display area DA and the non-display area NDA of the display device DD shown in FIG. 1. Therefore, the display area DA of the display device DD shown in FIG. 1, the display area DU-DA of the display unit DU shown in FIG. 4, the touch area TA of the touch sensing unit TSU shown in FIG. 5, and the fingerprint sensing area FSA of the fingerprint sensing unit FSU may correspond to each other. Similarly, the non-display area NDA of the display device DD shown in FIG. 1, the non-display area DU-NDA of the display unit DU shown in FIG. 4, the touch peripheral area TSA of the touch sensing unit TSU shown in FIG. 5, and the peripheral area FSSA of the fingerprint sensing unit FSU may correspond to each other. For example, the fingerprint sensing area FSA of the fingerprint sensing unit FSU may correspond to a portion of the display area DA of the display device DD shown in FIG. 1. That is, the fingerprint sensing area FSA of the fingerprint sensing unit FSU may have a size smaller than that of the display area DA of the display device DD.

The fingerprint sensing unit FSU may include a fingerprint scan driving circuit FSDC, a plurality of fingerprint signal lines F-SGL, and a plurality of fingerprint sensing pixels SP. The fingerprint sensing pixels SP may be disposed in the fingerprint sensing area FSA.

The fingerprint scan driving circuit FSDC may generate a plurality of fingerprint sensing scan signals and may sequentially output the fingerprint scan signals to a plurality of fingerprint scan lines FSL described later. The fingerprint scan driving circuit FSDC may further output other control signals to the fingerprint sensing pixels SP.

In the exemplary embodiment of the present disclosure, the fingerprint sensing unit FSU may include only the fingerprint scan driving circuit FSDC disposed at one side of the fingerprint sensing area FSA, however, according to another embodiment, the fingerprint sensing unit FSU may include at least two fingerprint scan driving circuits. The two fingerprint scan driving circuits may be disposed to face each other such that the fingerprint sensing area FSA is interposed therebetween, the fingerprint scan lines FSL may be commonly connected to the two fingerprint scan driving circuits.

Figure 8:
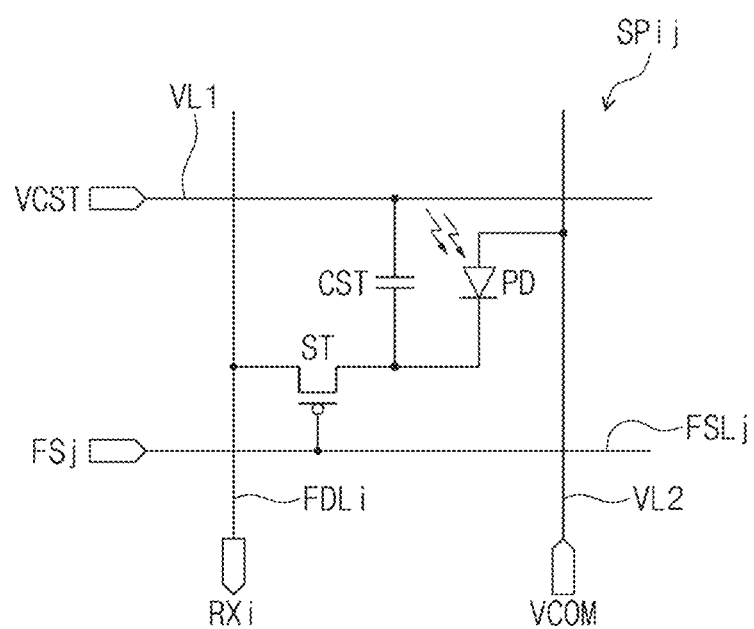
FIG. 8 is a circuit diagram showing a pixel connected to an i-th fingerprint sensing line and a j-th fingerprint scan line.

The fingerprint signal lines F-SGL may include the fingerprint scan lines FSL, fingerprint sensing lines FDL, a control signal line FCL, and a fingerprint power line PPL. The fingerprint scan lines FSL may be connected to corresponding fingerprint sensing pixels SP, respectively, and the fingerprint sensing lines FDL may be connected to corresponding fingerprint sensing pixels SP, respectively. FIG. 6 shows one fingerprint power line PLL, however, each of the fingerprint sensing pixels SP may be connected to two or more fingerprint power lines. As shown in FIG. 8 described later, at least one of a first voltage VCST and a second voltage VCOM may be provided to the fingerprint sensing pixels SP through the fingerprint power line PLL. The control signal line FCL may provide control signals to the fingerprint scan driving circuit FSDC.

The fingerprint signal lines F-SGL may overlap the fingerprint sensing area FSA and the peripheral area FSSA. The fingerprint signal lines F-SGL may be connected to a portion of the auxiliary lines SSL shown in FIG. 4 through the contact holes CH. The fingerprint signal lines F-SGL may be electrically connected to the third-type signal pads FS-PD through the auxiliary lines SSL.

In the exemplary embodiment, the fingerprint scan driving circuit FSDC may be formed on the same layer as the fingerprint sensing pixels SP, however, the present disclosure should not be limited thereto or thereby. For example, the fingerprint scan driving circuit FSDC may be implemented in an independent integrated circuit chip and may be electrically connected to at least one side of the fingerprint sensing unit FSU. In addition, according to another embodiment, the fingerprint scan driving circuit FSDC may be provided in the readout circuit ROC and may provide the fingerprint scan signals to the fingerprint scan lines FSL through connection lines.

Figure 7:
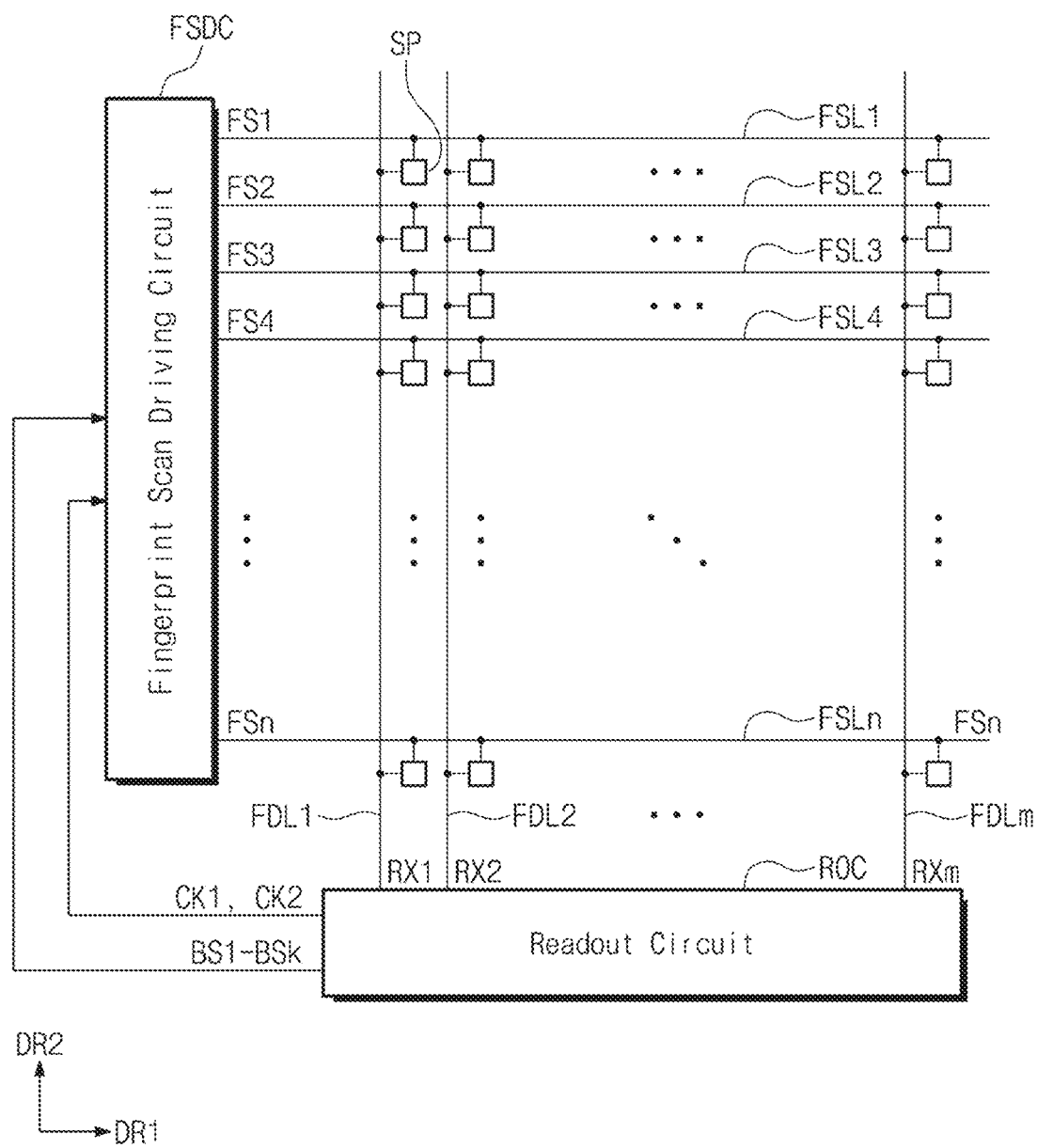
FIG. 7 is a view showing a connection relationship between fingerprint sensing pixels and a fingerprint scan driving circuit and between the fingerprint sensing pixels and a readout circuit.

FIG. 7 is a view showing a connection relationship between the fingerprint sensing pixels SP and the fingerprint scan driving circuit FSDC and between the fingerprint sensing pixels SP and the readout circuit ROC. FIG. 8 is a circuit diagram showing a pixel Spij connected to an i-th fingerprint sensing line FDLi and a j-th fingerprint scan line FSLj.

Referring to FIGS. 7 and 8, each of the fingerprint sensing pixels SP may be connected to a corresponding fingerprint sensing line among a plurality of fingerprint sensing lines FDL1 to FDLm and a corresponding fingerprint scan line among a plurality of fingerprint scan lines FSL1 to FSLn. For example, the fingerprint sensing pixel Spij may be connected to the i-th fingerprint sensing line FDLi and the j-th fingerprint scan line FSLj.

The fingerprint scan driving circuit FSDC may output fingerprint scan signals FS1 to FSn to the fingerprint scan lines FSL1 to FSLn in response to block selection signals BS1 to BSk and first and second clock signals CK1 and CK2. The block selection signals BS1 to BSk and the first and second clock signals CK1 and CK2 may be provided from the readout circuit ROC.

The readout circuit ROC may receive fingerprint sensing signals RX1 to RXm from the fingerprint sensing lines FDL1 to FDLm. In the exemplary embodiment of the present disclosure, the readout circuit ROC may provide the block selection signals BS1 to BSk and the first and second clock signals CK1 and CK2 to the fingerprint scan driving circuit FSDC to drive the fingerprint scan lines included in a predetermined sensing area among the fingerprint scan lines FSL1 to FSLn. In addition, the readout circuit ROC may receive the fingerprint sensing signal from the fingerprint sensing lines included in a predetermined sensing area among the fingerprint sensing lines FDL1 to FDLm. The readout circuit ROC may further provide other signals needed for an operation of the fingerprint scan driving circuit FSDC in addition to the block selection signals BS1 to BSk and the first and second clock signals CK1 and CK2.

Referring to FIG. 8, the fingerprint sensing pixel SPij may include a switching transistor ST, a capacitor CST, and a photodiode PD. The switching transistor ST may include a first electrode connected to the fingerprint sensing line FDLi, a second electrode connected to one end of the capacitor CST, and a gate electrode connected to the fingerprint scan line FSLj. The one end of the capacitor CST may be connected to the second electrode of the switching transistor ST, and the other end of the capacitor CST may be connected to a first voltage line VL1 to which the first voltage VCST is applied. The photodiode PD may include an anode connected to a second voltage line VL2 to which the second voltage VCOM is applied and a cathode connected to the second electrode of the switching transistor ST.

A current may flow through the photodiode PD when a light is applied to the photodiode PD, and a level of the voltage may be almost proportional to an amount of the light. Electric charges generated by the photodiode PD may be charged in the capacitor CST. When the fingerprint scan signal FSj having the low level is received through the fingerprint scan line FSLj, the switching transistor ST may be turned on, and the electric charges charged in the capacitor CST may be discharged, thereby outputting a fingerprint sensing signal RXi via the fingerprint sensing line FDLi.

The fingerprint sensing pixel SPij shown in FIG. 8 is merely exemplary, and the present disclosure should not be limited thereto or thereby. According to another embodiment, the fingerprint sensing pixel SPij may include two or more switching transistors.

Figure 9:
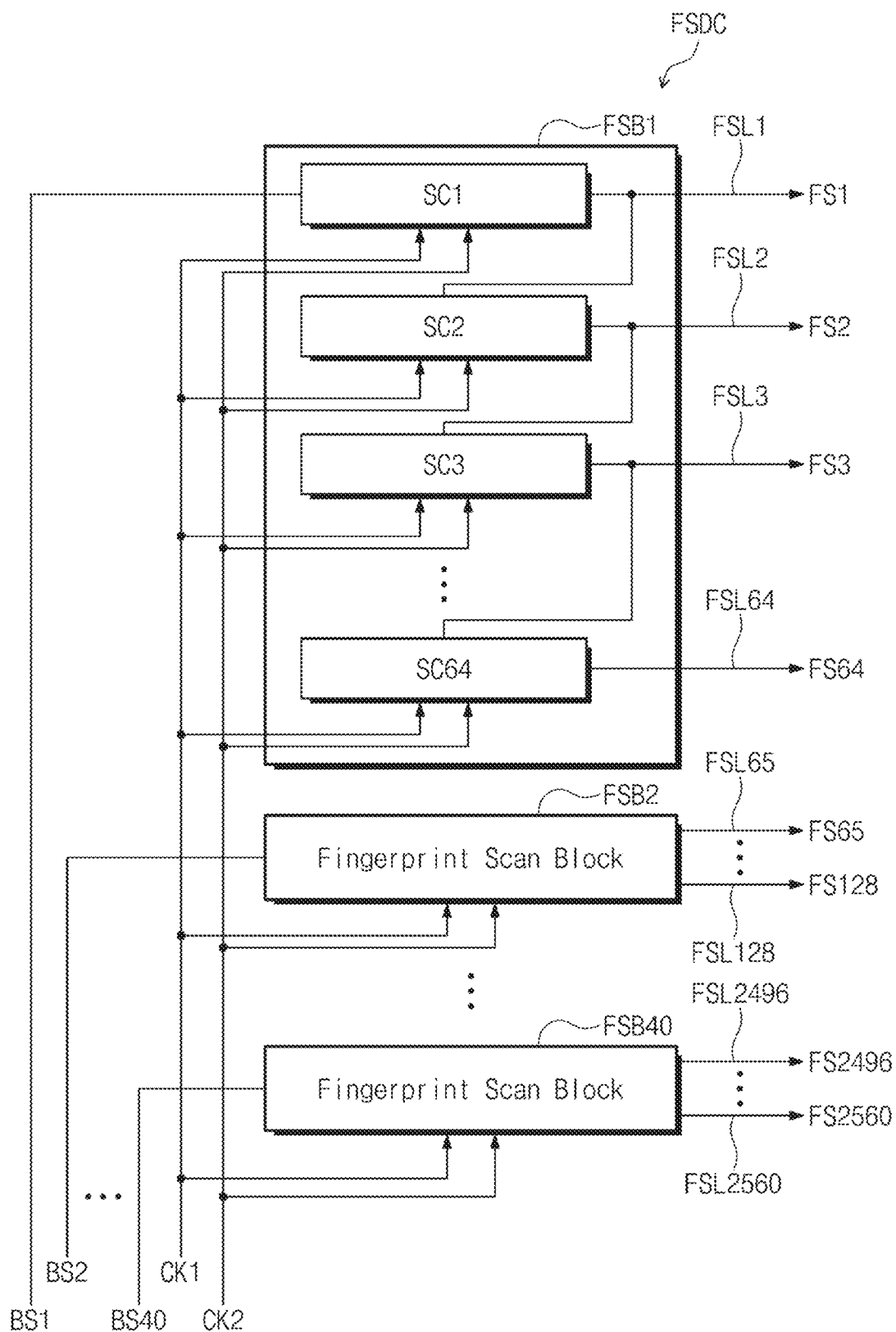
FIG. 9 is a view showing a circuit configuration of a fingerprint scan driving circuit shown in FIG. 6.

FIG. 9 is a view showing a circuit configuration of the fingerprint scan driving circuit FSDC shown in FIG. 7.

The fingerprint sensing unit FSU shown in FIG. 7 may include m fingerprint sensing pixels SP in the first direction DR1 and n fingerprint sensing pixels SP in the second direction DR2. In the present exemplary embodiment, "m" is about 1280 (m=1280), and "n" is about 2560 (n=2560). In this case, the fingerprint sensing unit FSU may include the fingerprint sensing pixels SP of 1280 by 2560 (1280×2560). Accordingly, the fingerprint sensing unit FSU may include 1280 fingerprint sensing lines FDL1 to FDL1280 and 2560 fingerprint scan lines FSL1 to FSL2560. The number of the fingerprint sensing pixels SP, the number of the fingerprint sensing lines, and the number of the fingerprint scan lines are merely exemplary, and the present disclosure should not be limited thereto or thereby. In addition, in the exemplary embodiment, the number of the fingerprint sensing pixels SP arranged in the first direction DR1 is smaller than the number of the fingerprint sensing pixels SP arranged in the second direction DR2, however, the present disclosure should not be limited thereto or thereby. According to another embodiment, the number of the fingerprint sensing pixels SP arranged in the first direction DR1 may be equal to or greater than the number of the fingerprint sensing pixels SP arranged in the second direction DR2.

Referring to FIG. 9, the fingerprint scan driving circuit FSDC may include first to fortieth fingerprint scan blocks FSB1 to FSB40. Each of the first to fortieth fingerprint scan blocks FSB1 to FSB40 may correspond to 64 fingerprint scan lines. For example, the first fingerprint scan block FSB1 may sequentially drive the fingerprint scan lines FSL1 to FSL64, and the second fingerprint scan block FSB2 may sequentially drive the fingerprint scan lines FSL65 to FSL128.

Each of the first to fortieth fingerprint scan blocks FSB1 to FSB40 may be operated in response to a corresponding block selection signal among the block selection signals BS1 to BS40. For example, the first fingerprint scan block FSB1 may sequentially drive the fingerprint scan lines FSL1 to FSL64 when the block selection signal BS1 is activated at a predetermined level, e.g., a lower level, and the second fingerprint scan block FSB2 may sequentially drive the fingerprint scan lines FSL65 to FSL128 when the block selection signal BS2 is activated at a predetermined level, e.g., a lower level.

Each of the first to fortieth fingerprint scan blocks FSB1 to FSB40 may further receive the first and second clock signals CK1 and CK2. The block selection signals BS1 to BS40 and the first and second clock signals CK1 and CK2 may be provided from the readout circuit ROC shown in FIG. 7.

Since the first to fortieth fingerprint scan blocks FSB1 to FSB40 may have the same circuit configurations and may be operated similarly, only the first fingerprint scan block FSB1 is shown and described in detail.

The first fingerprint scan block FSB1 may include first to sixty-fourth stages SC1 to SC64. The first stage SC1 may output the fingerprint scan signal FS1 to the corresponding fingerprint scan line FSL1 in response to the first and second clock signals CK1 and CK2 when the block selection signal BS1 is activated.

Each of second to sixty-fourth stages SC2 to SC64 may output a corresponding fingerprint scan signal among the fingerprint scan signals FS2 to FS64 to a corresponding fingerprint scan line among the fingerprint scan lines FSL2 to FSL64 in response to the fingerprint scan signal and the first and second clock signals CK1 and CK2 from a previous stage.

Figure 10:
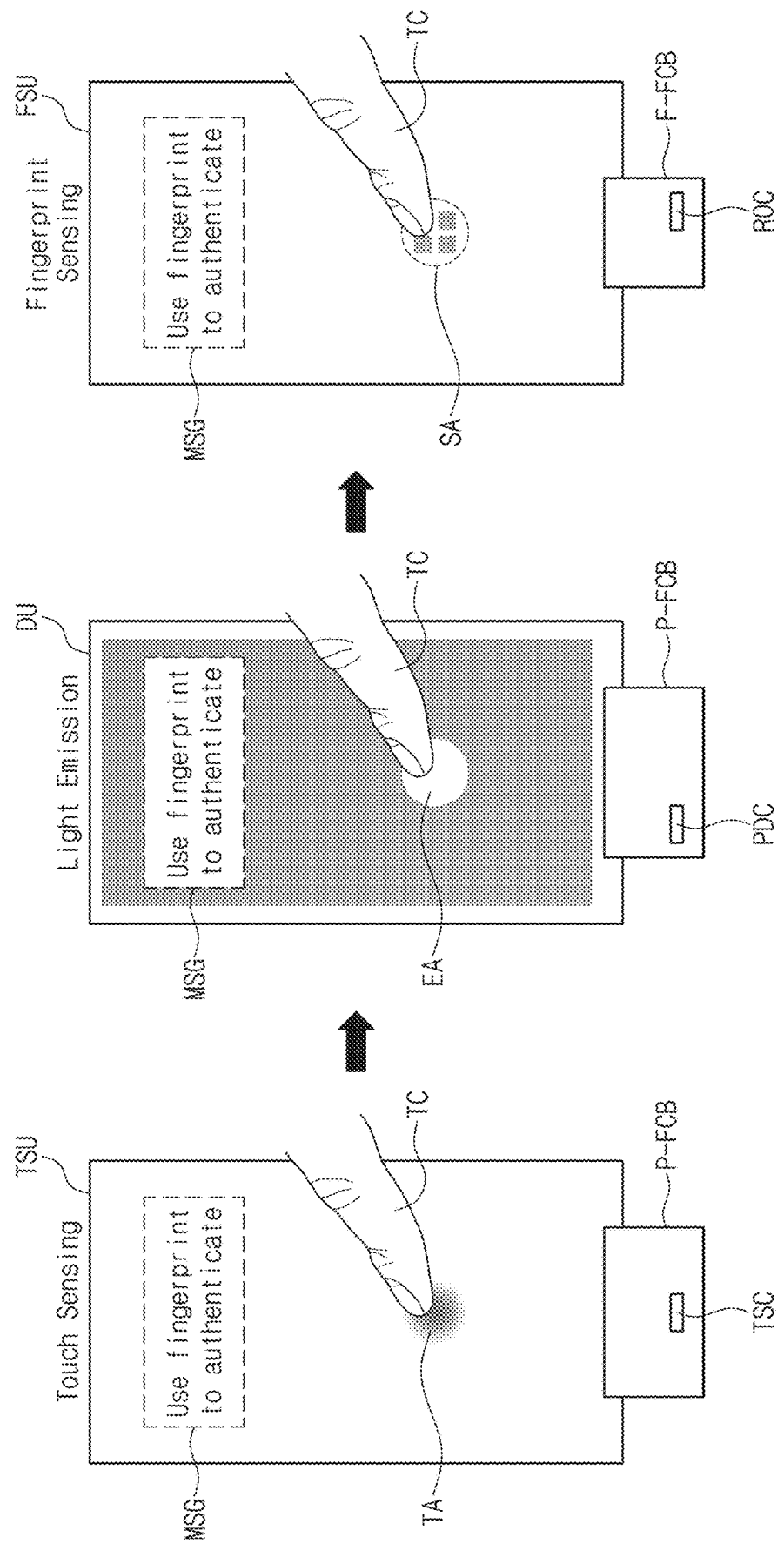
FIG. 10 is a view explaining an operation of a display device according to an embodiment of the inventive concepts.

FIG. 10 is a view explaining an operation of the display device according to an exemplary embodiment of the present disclosure.

For the convenience of description, the touch sensing unit TSU, the display unit DU, and the fingerprint sensing unit FSU of the display device DD (refer to FIGS. 3B and 3C) are separately shown in FIG. 10.

Referring to FIG. 10, when a message MSG "use fingerprint to authenticate" is displayed at a predetermined position in the display area DA of the display device DD, the user will touch the display device DD using a finger with a fingerprint registered in advance. The type and form of the message MSG displayed on the display device DD may vary. In addition, a touch sensing process may be performed without a specific message MSG. For example, the display device DD may sense the user input TC (refer to FIG. 1) even when the display unit DU is turned off to save power and may perform a user authentication function and an unlock function.

The touch sensing unit TSU may sense the user input TC and may provide the position information of the user input TC to the touch sensing circuit TSC. The touch sensing circuit TSC may transmit the position information from the touch sensing unit TSU to the panel driving circuit PDC.

The touch sensing circuit TSC may set the touch area TA based on the position information from the touch sensing unit TSU and may provide information about the set touch area TA to the panel driving circuit PDC. The panel driving circuit PDC may select a light emitting area EA corresponding to the touch area TA and may control the display unit DU such that a brightness of the light emitting area EA increases. The panel driving circuit PDC may display the message MSG in the predetermined area of the display unit DU and may increase the brightness of the light emitting area EA.

For example, the panel driving circuit PDC may control the display unit DU such that the brightness of the image displayed through the light emitting area EA increases by a predetermined level or may operate to display the brightness of the image displayed through the light emitting area EA has a predetermined first level.

Then, the panel driving circuit PDC may provide a signal to the readout circuit ROC to select the sensing area SA of the fingerprint sensing unit FSU corresponding to the touch area TA. The readout circuit ROC may receive the fingerprint information with respect to the user input TC from the sensing area SA of the fingerprint sensing unit FSU.

As described above, the panel driving circuit PDC may increase the brightness of the light emitting area EA corresponding to the touch area TA and thus may improve the fingerprint sensing performance of the fingerprint sensing unit FSU. In addition, the readout circuit ROC may drive only the sensing area SA of the fingerprint sensing unit FSU corresponding to the touch area TA and thus may reduce power consumption.

Figure 11A:
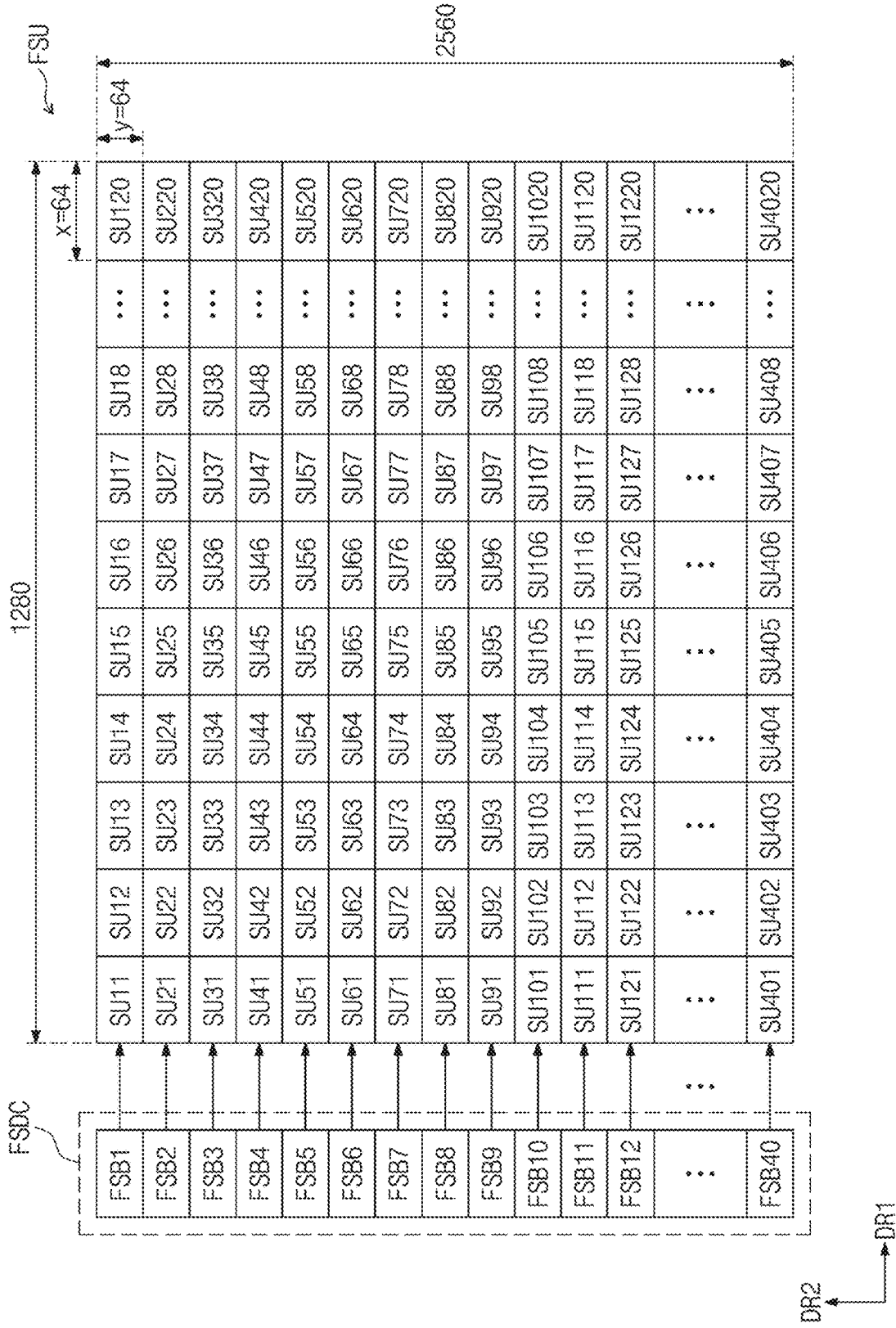
FIG. 11A is a view showing a fingerprint sensing unit and a fingerprint scan driving circuit.

FIG. 11A is a view showing the fingerprint sensing unit FSU and a fingerprint scan driving circuit FSDC.

Referring to FIG. 11A, the fingerprint sensing unit FSU may include about 1280 fingerprint sensing pixels SP (refer to FIG. 7) in the first direction DR1 and about 2560 fingerprint sensing pixels SP (refer to FIG. 7) in the second direction DR2. In the exemplary embodiment, the fingerprint sensing unit FSU may include about 20 sensing units in the first direction DR1 and about 40 sensing units in the second direction DR2. Each of the sensing units SU11 to SU4020 may include x fingerprint sensing pixels SP (refer to FIG. 6) in the first direction DR1 and y fingerprint sensing pixels SP (refer to FIG. 6) in the second direction DR2. Each of "x" and "y" is a natural number, and in the exemplary embodiment, "x" is 64, and "y" is 64.

In the fingerprint sensing unit FSU shown in FIG. 11A, the number of the fingerprint sensing pixels SP, the number of the sensing units SU11 to SU4020 included in the fingerprint sensing unit FSU and the number of fingerprint sensing pixels SP included in the sensing units SU11 to SU4020 are merely exemplary for convenience of description, and the present disclosure should not be limited thereto or thereby. In addition, in the fingerprint sensing unit FSU shown in FIG. 11A, the number of the fingerprint sensing pixels SP arranged in the second direction DR2 is greater than the number of the fingerprint sensing pixels SP arranged in the first direction DR1, however, the present disclosure should not be limited thereto or thereby.

The number of the fingerprint scan blocks FSB1 to FSB40 in the fingerprint scan driving circuit FSDC may be equal to the number of the sensing units arranged in the second direction DR2. In the exemplary embodiment shown in FIG. 11A, the fingerprint sensing unit FSU may include about 40 sensing units SU11 to SU4020 in the second direction DR2, and the fingerprint scan driving circuit FSDC may include the first to fortieth fingerprint scan blocks FSB1 to FSB40.

Each of the first to fortieth fingerprint scan blocks FSB1 to FSB40 may drive the fingerprint scan lines connected to a corresponding sensing unit among the sensing units SU11 to SU4020. For example, the first fingerprint scan block FSB1 may drive the fingerprint scan lines connected to the sensing units SU11 to SU120 sequentially arranged in the first direction DR1, and the second fingerprint scan block FSB2 may drive the fingerprint scan lines connected to the sensing units SU21 to SU220 sequentially arranged in the first direction DR1.

Figure 11B:
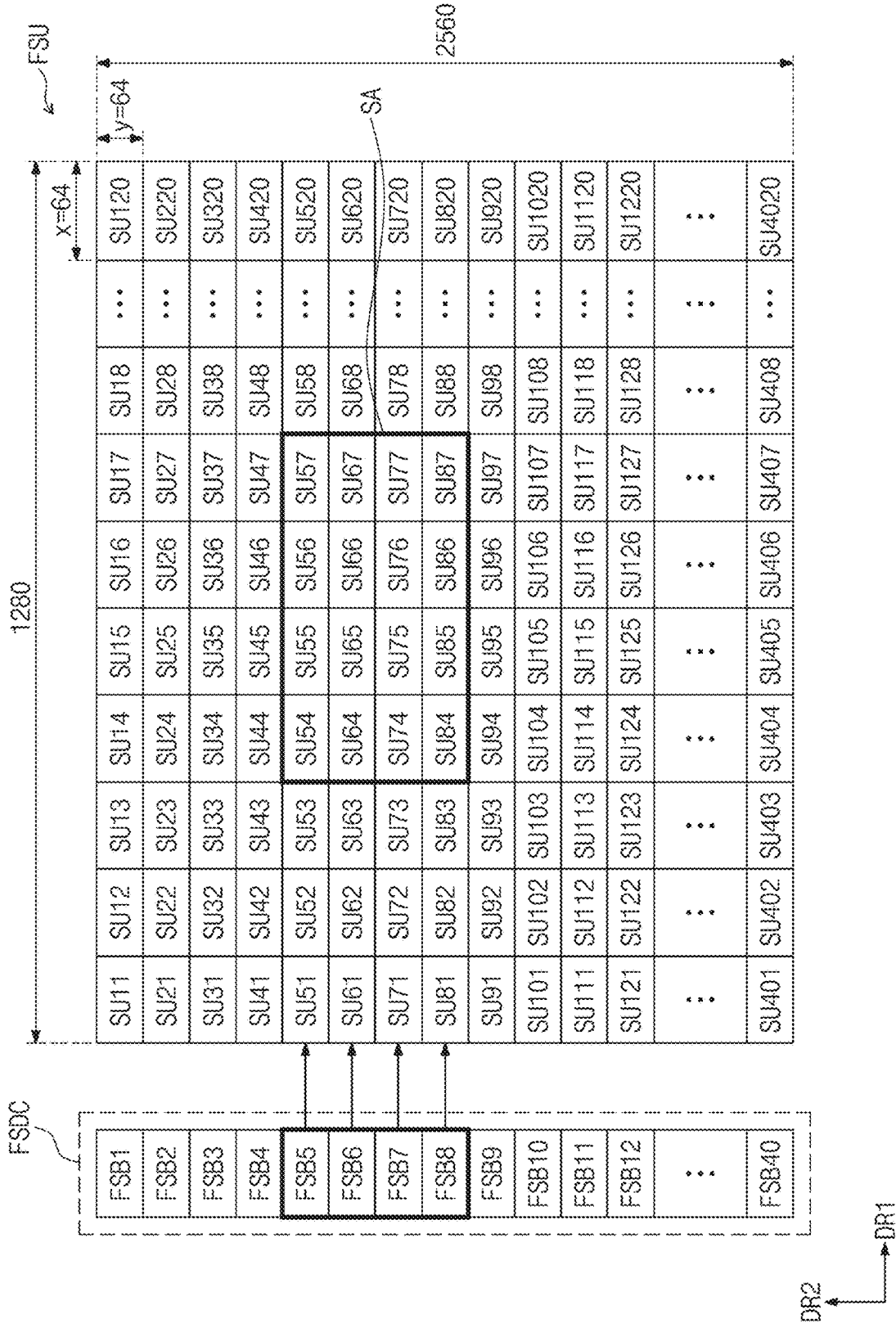
FIG. 11B is a view showing a fingerprint scan driving circuit that drives fingerprint scan lines in a sensing area of a fingerprint sensing unit.

FIG. 11B is a view showing the fingerprint scan driving circuit that drives the fingerprint scan lines in the sensing area of the fingerprint sensing unit.

Referring to FIG. 11B, the sensing area SA may include four sensing units in the first direction DR1 and four sensing units in the second direction DR2, i.e., a total of 16 (4×4) sensing units. That is, the touch sensing circuit TSC shown in FIG. 3C may provide the information about the touch area TA (refer to FIG. 10) to the panel driving circuit PDC when a predetermined area of the touch sensing unit TSU is touched. The panel driving circuit PDC may output the control signal to the readout circuit ROC to allow the 16 sensing units corresponding to the touch area TA to be selected as the sensing area SA. FIG. 11B shows 16 sensing units SU54 to SU57, SU64 to SU67, SU74 to SU77, and SU84 to SU87 that are selected as the sensing area SA.

Fifth to eighth fingerprint scan blocks FSB5 to FSB8 in the fingerprint scan driving circuit FSDC may sequentially drive the fingerprint scan lines corresponding to the sensing units SU54 to SU57, SU64 to SU67, SU74 to SU77, and SU84 to SU87 in response to block selection signals BS5 to BS8 that are activated at a low level.

In the present exemplary embodiment, since only the fifth to eighth fingerprint scan blocks FSB5 to FSB8 corresponding to the sensing units SU54 to SU57, SU64 to SU67, SU74 to SU77, and SU84 to SU87 in the sensing area SA among the fingerprint scan blocks FSB1 to FSB40 in the fingerprint scan driving circuit FSDC operate, the power consumption may be reduced.

Figure 12:
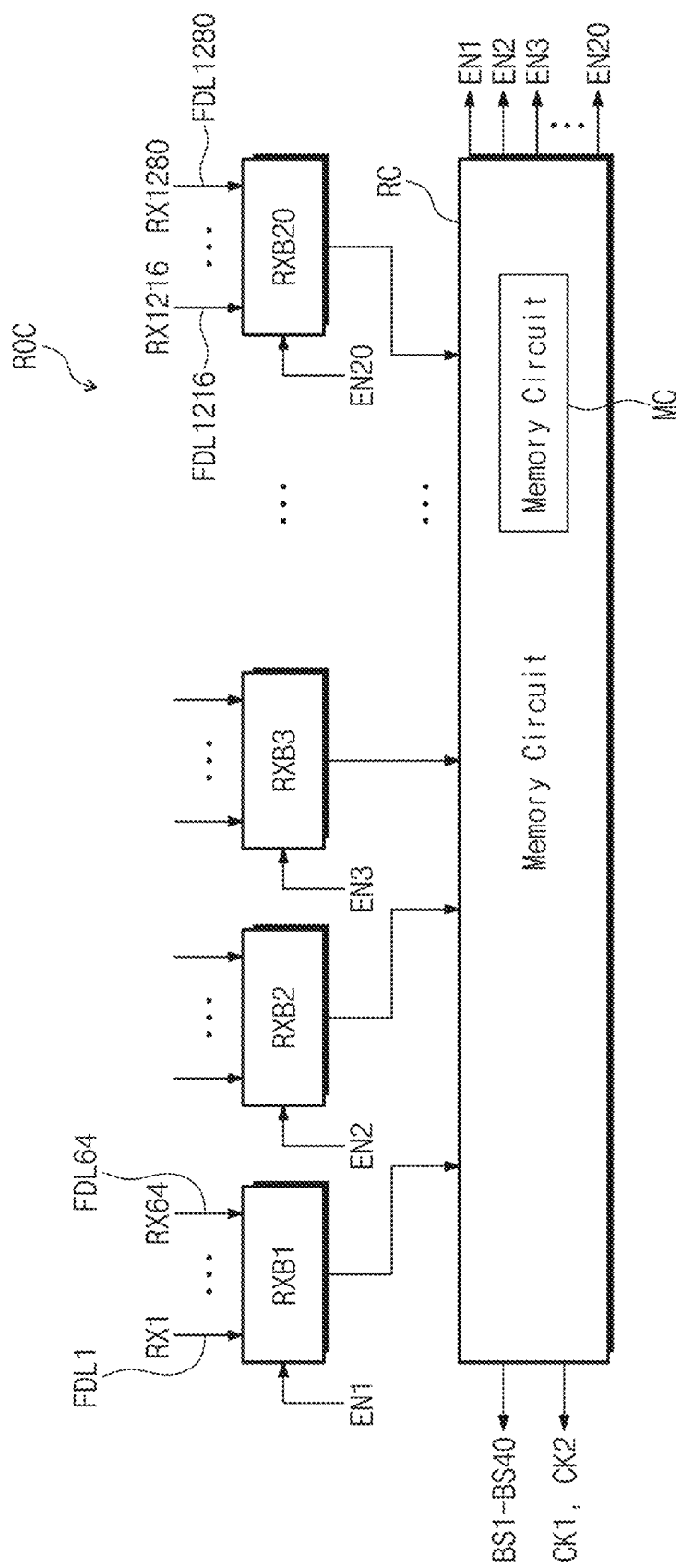
FIG. 12 is a block diagram showing a readout circuit according to an embodiment of the inventive concepts.

FIG. 12 is a block diagram showing the readout circuit ROC according to an exemplary embodiment of the present disclosure.

Referring to FIG. 12, the readout circuit ROC may include readout blocks RXB1 to RXB20 and a control circuit RC.

Referring to FIGS. 11A and 12, the number of the readout blocks RXB1 to RXB20 may be equal to the number of the sensing units arranged in the first direction DR1 among the sensing units SU11 to SU4020 included in the fingerprint sensing unit FSU. In the exemplary embodiment shown in FIG. 11A, since the fingerprint sensing unit FSU includes sensing units in the first direction DR1, the readout circuit ROC may include first to twentieth readout blocks RXB1 to RXB20.

Each of the first to twentieth readout blocks RXB1 to RXB20 may receive the fingerprint sensing signals from the fingerprint sensing lines connected to the corresponding sensing unit among the sensing units SU11 to SU4020. For example, the first readout block RXB1 may receive the fingerprint sensing signals RX1 to RX64 from the fingerprint sensing lines FDL1 to FDL64 connected to the sensing units SU11, SU21, SU31, . . . , SU401 sequentially arranged in the second direction DR2. The twentieth readout block RXB20 may receive the fingerprint sensing signals RX1216 to RX1280 from the fingerprint sensing lines FDL1216 to FDL1280 connected to the sensing units SU120, SU220, SU320, . . . , SU4020 sequentially arranged in the second direction DR2.

The control circuit RC may output enable signals EN1 to EN20 in response to the control signal from the panel driving circuit PDC to select the readout blocks RXB1 to RXB20.

The control circuit RC may output the block selection signals BS1 to BS40 and the first and second clock signals CK1 and CK2 in response to the control signal from the panel driving circuit PDC.

In the exemplary embodiment shown in FIG. 11B, when the sensing units SU54 to SU57, SU64 to SU67, SU74 to SU77, and SU84 to SU87 in the sensing area SA are selected, the control circuit RC may activate only the block selection signals BS5 to BS8 among the block selection signals BS1 to BS40 at a low level and may deactivate the remaining block selection signals BS1 to BS4 and BS9 to BS40 at a high level.

The control circuit RC may include a memory circuit MC that accumulates and stores the fingerprint sensing signals received from the fingerprint sensing pixels SP. The memory circuit MC may include, for example, at least one of a non-volatile memory and a volatile memory.

Figure 13:
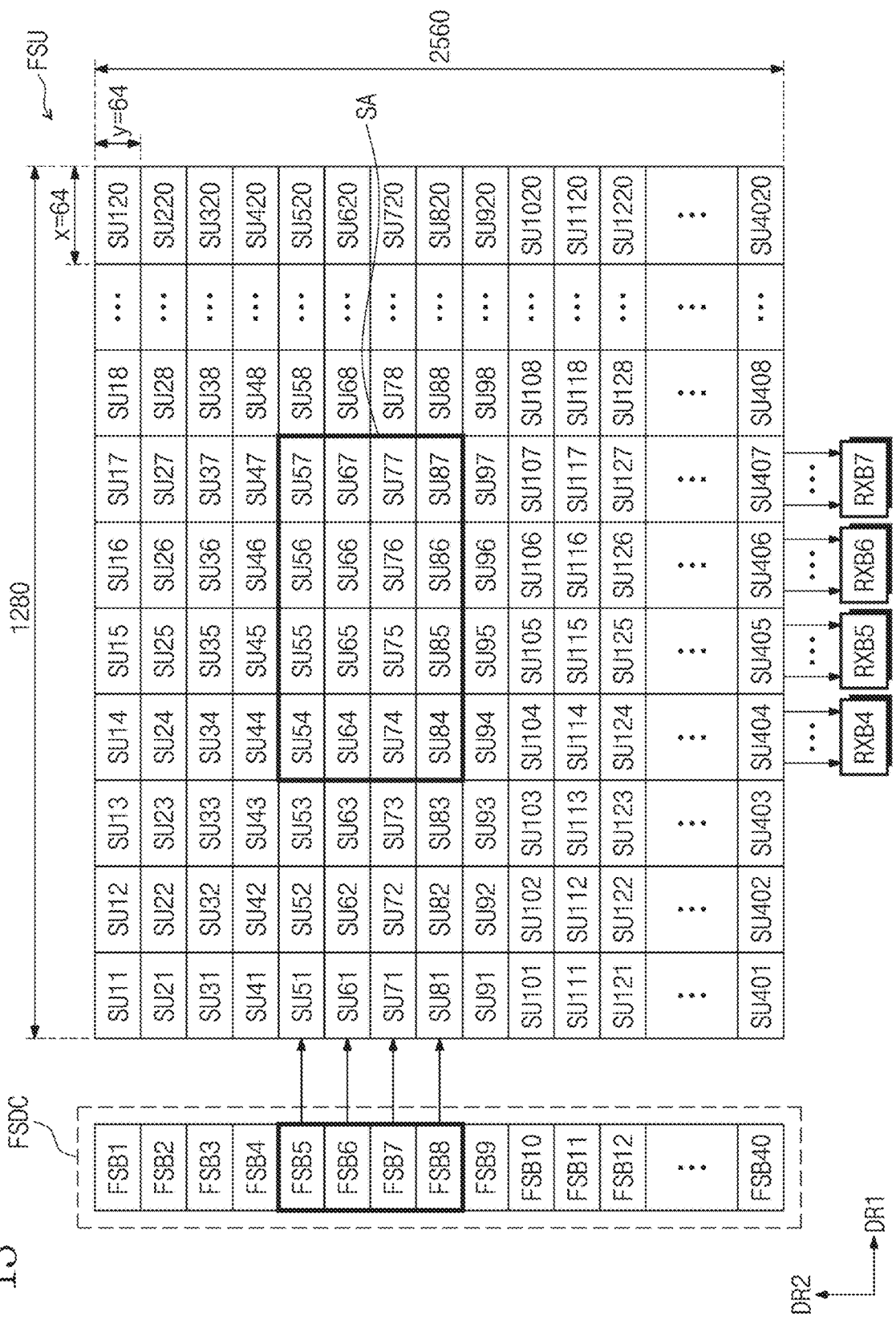
FIG. 13 is a view showing readout blocks that receive fingerprint sensing signals from fingerprint sensing lines in a sensing area of a fingerprint sensing unit.

FIG. 13 is a view showing readout blocks that receive fingerprint sensing signals from the fingerprint sensing lines in the sensing area of the fingerprint sensing unit.

Referring to FIGS. 12 and 13, when the sensing units SU54 to SU57, SU64 to SU67, SU74 to SU77, and SU84 to SU87 in the sensing area SA are selected, only the enable signals EN4 to EN7 among the enable signals EN1 to EN20 may be activated at the predetermined level, and the other enable signals EN1 to EN3 and EN8 to NE20 may be maintained in the deactivated state. In this case, the readout blocks RXB4 to RXB7 corresponding to the sensing area among the readout blocks RXB1 to RXB20 may receive the fingerprint sensing signals from the fingerprint sensing lines and may provide the received fingerprint sensing signals to the control circuit RC. Accordingly, the readout circuit RC may receive only the fingerprint sensing signals from the fingerprint sensing lines in the sensing area SA through the readout blocks RXB4 to RXB7 and the control circuit RC. Meanwhile, the readout blocks RXB1 to RXB3 and RXB8 to RXB20 that do not correspond to the sensing area and receive the other enable signals EN1 to EN3 and EN8 to EN20 maintained in the deactivated state may maintain a non-operation state. Therefore, the power consumption of the readout circuit ROC may be reduced.

According to the exemplary embodiment, the readout circuit ROC may perform a fingerprint authentication process using the fingerprint sensing signals from the fingerprint sensing lines in the sensing area SA among the fingerprint sensing signals RX1 to RX1280 from the fingerprint sensing lines FDL1 to FDL1280. Thus, the data throughput required for the fingerprint authentication process may be reduced.

Referring to FIG. 8 again, the fingerprint sensing pixel SPij may include the switching transistor ST, the capacitor CST, and the photodiode PD. Due to the production process, there may be a characteristic deviation for each of the switching transistor ST, the capacitor CST, and the photodiode PD of each of the fingerprint sensing pixels SP (refer to FIG. 7). In addition, a leakage current may flow through the switching transistor ST and the photodiode PD. For example, a current path may be formed between the second voltage line VL2 and the fingerprint sensing line FDLi during the turned-off state of the switching transistor ST, and thus, the leakage current may flow. There may be a difference in leakage current for each fingerprint sensing pixel (refer to FIG. 7).

The fingerprint sensing pixels SP (refer to FIG. 7) may sense the light reflected by different areas of the fingerprint of the user input TC and may generate an electrical signal corresponding to the sensed light. Each of the fingerprint pixels SP may generate the electrical signal corresponding to the light reflected by a ridge of the fingerprint or may generate the electrical signal corresponding to the light reflected by a valley between ridges of the fingerprint. An amount of the light sensed by the photodiode PD may differ depending on a shape of the fingerprint by which the light is reflected, and the electrical signals having different levels from each other may be generated depending on the amount of the sensed light. That is, each of the fingerprint sensing signals RX1 to RX1280 from the fingerprint sensing pixels SP may include contrast information (or image information), the readout circuit ROC may perform a processing operation on the fingerprint sensing signals RX1 to RX1280 to determine whether the area corresponding to each fingerprint sensing pixel SP is the ridge or valley, and an overall fingerprint image may be formed by combining the determined information.

When a characteristic distribution of the fingerprint sensing pixels SP is large, it is difficult to accurately recognize the fingerprint. The display device DD in the exemplary embodiment may sense the characteristic distribution of the fingerprint sensing pixels SP in a test mode and may calculate a compensation value based on the sensed characteristic distribution. The display device DD may add the compensation value to the fingerprint information sensed in a fingerprint sensing mode to obtain corrected fingerprint information. Accordingly, the display device DD may compensate for a deviation between fingerprint sensors.

Figure 14:
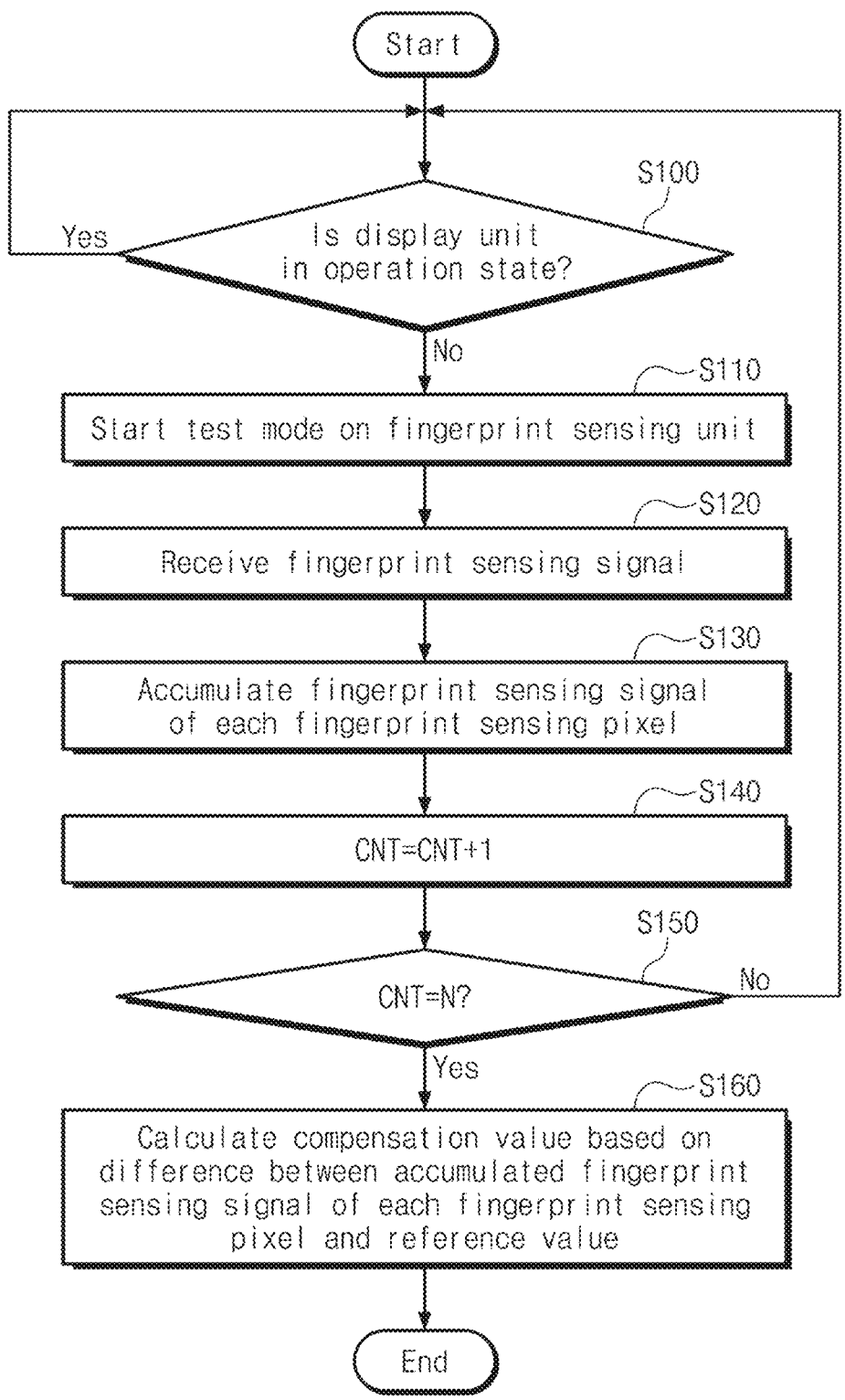
FIG. 14 is a flowchart showing a method of operating a display device in a test mode according to an embodiment of the inventive concepts.

FIG. 14 is a flowchart showing a method of operating the display device in the test mode according to an exemplary embodiment of the present disclosure.

Referring to FIGS. 3B and 14, the panel driving circuit PDC determines whether the display unit DU is in an operation state (S100).

When the display unit DU is not in the operation state, the panel driving circuit PDC starts the test mode for the fingerprint sensing unit FSU (S110). In addition, when the display unit DU is in the non-operation state and the user input TC (refer to FIG. 1) is not provided, the panel driving circuit PDC may start the test mode for the fingerprint sensing unit FSU.

In the test mode, the readout circuit ROC sets the sensing area SA of the fingerprint sensing unit FSU and outputs the block selection signals BS1 to BSk and the first and second clock signals CK1 and CK2 to the fingerprint scan driving circuit FSDC to drive the set sensing area SA. The readout circuit ROC receives the fingerprint sensing signals from the sensing area SA (S120). Although the user input TC is not provided, the readout circuit ROC may receive the fingerprint sensing signals from the sensing area SA.

The readout circuit ROC stores the fingerprint sensing signal corresponding to each of the fingerprint sensing pixels SP in the sensing area SA in the memory circuit MC (refer to FIG. 12) (S130). According to another embodiment, the readout circuit ROC may not include the memory circuit MC and may store the fingerprint sensing signals in the memory MM (refer to FIG. 3C).

The readout circuit ROC increases a count value CNT by one (1) (S140).

The readout circuit ROC determines whether the count value reaches a predetermined value (N) (S150). When the count value does not reach the predetermined value (N), the operation returns to the operation (S100) that determines whether the display unit DU is in the operation state.

Operations (S100 to S140) are repeatedly performed until the count value CNT reaches the predetermined value (N). In particular, the readout circuit ROC accumulates and stores the fingerprint sensing signal corresponding to each of the fingerprint sensing pixels SP in the sensing area SA.

When the count value CNT reaches the predetermined value (N), the readout circuit ROC calculates the compensation value based on a difference between the accumulated fingerprint sensing signal of each of the fingerprint sensing pixels SP and a reference value (S160).

When the display device DD is used by the user, the display unit DU is in the operation state (or on-state). It is appropriate to perform the test mode for the fingerprint sensing unit FSU when the display unit DU is not in the operation state. In the exemplary embodiment, the panel driving circuit PDC may perform the test mode on the fingerprint sensing unit FSU during a time period when the user does not use the display device DD (for example, between 2 am and 4 am). In addition, since the characteristic distribution of the fingerprint sensing pixels SP may vary depending on an amount of an external light, it may be easy to measure the characteristic distribution of the fingerprint sensing pixels SP when the test mode on the fingerprint sensing unit FSU is performed at night in the absence of external light, however, the present disclosure should not be limited thereto or thereby. For example, the panel driving circuit PDC may perform the test mode on the fingerprint sensing unit FSU in the presence of external light.

FIG. 15A is a view showing accumulated values of the fingerprint sensing signals received from the sensing area SA of the fingerprint sensing unit FSU in the test mode.

FIG. 15A is a view exemplarily illustrating the accumulated values obtained by accumulating N times the fingerprint sensing signals received from 256 by 256 (256×256) fingerprint sensing pixels defined by 256 fingerprint sensing pixels arranged in the first direction DR1 and 256 fingerprint sensing pixels arranged in the second direction DR2 among 1280 by 2560 (1280×2560) fingerprint sensing pixels defined by 1280 fingerprint sensing pixels arranged in the first direction DR1 and 2560 fingerprint sensing pixels arranged in the second direction DR2. In FIG. 15A, "i" and "j" respectively denote positions of the fingerprint sensing pixels in the first direction DR1 and the second direction DR2.

The accumulated value (Asum(i,j)) of the fingerprint sensing signals provided from the fingerprint sensing pixels SP is represented by the following Equation 1.

$$A_{sum(i,j)} = \sum_{k=1}^{N} A_{(i,j)}$$ Equation 1

As described with reference to FIGS. 11B and 13, the sensing area SA may include 4 by 4 (4×4) sensing units defined by 4 sensing units arranged in the first direction DR1 and 4 sensing units arranged in the first direction DR1, and each of the sensing units may include 64 by 64 (64×64) fingerprint sensing pixels SP. Therefore, the sensing area SA may include 256 by 256 (256×256) fingerprint sensing pixels SP.

Ideally, when there is no user input TC (refer to FIG. 1), the fingerprint sensing signals received from the 256 by 256 (256×256) fingerprint sensing pixels SP should all be the same. However, as shown in FIG. 15A, the accumulated values of the fingerprint sensing signals received from the 256 by 256 (256×256) fingerprint sensing pixels SP may be different from each other.

FIG. 15B is a view showing compensation values calculated in the test mode.

Referring to FIGS. 15A and 15B, an average value of differences between an average value (Avg(Asum(i,j)) of the accumulated values of the fingerprint sensing signals of the total of (256 by 256 (256×256)) fingerprint sensing pixels SP in the sensing area SA and the accumulated value (Asum(i,j)) of each of the fingerprint sensing signal may be calculated as the compensation value. The compensation value Aoffset may be calculated by the following Equation 2.

$$A_{offset} = \Delta(\text{Avg}(A_{sum(i,j)}), A_{sum(i,j)})/N$$ Equation 2

In the exemplary embodiment, the reference value of operation S150 shown in FIG. 14 is the average value (Avg(Asum(i,j))) of the accumulated values of the fingerprint sensing signals of the total of (256 by 256 (256×256)) fingerprint sensing pixels SP in the sensing area SA, however, the present disclosure should not be limited thereto or thereby. According to another embodiment, the reference value may be set to an arbitrary value.

FIG. 15C is a view showing results obtained by adding the compensation values Aoffset to the accumulated values Asum(i,j) of the fingerprint sensing signal in the test mode.

As shown in FIGS. 15A, 15B, and 15C, when the compensation values Aoffset are added to the accumulated values Asum(i,j), the accumulated values of the fingerprint sensing signals received from the 256 by 256 (256×256) fingerprint sensing pixels SP are all the same.

In the fingerprint sensing mode described later, the readout circuit ROC may obtain the fingerprint sensing signals in which the characteristic distribution of the fingerprint sensing pixels SP is compensated by adding the compensation values shown in FIG. 15B to the fingerprint sensing signals from the fingerprint sensing pixels SP.

Figure 16:
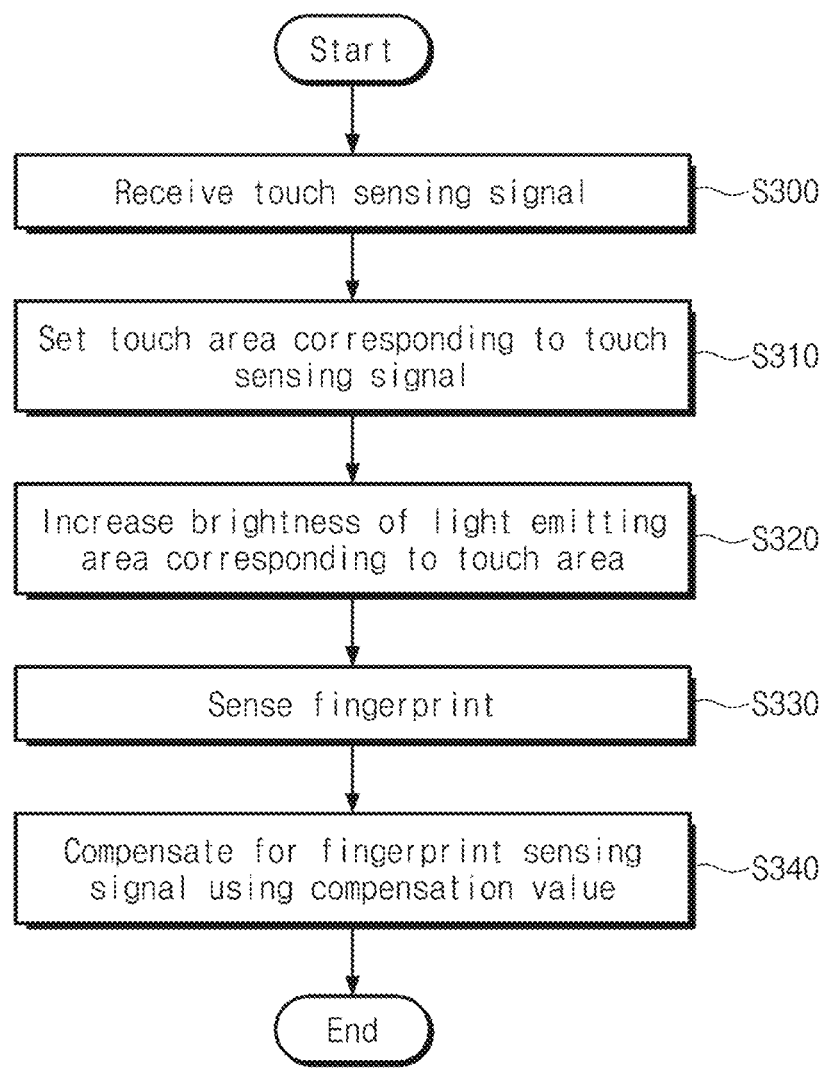
FIG. 16 is a flowchart showing a method of operating a display device in a fingerprint sensing mode according to an embodiment of the inventive concepts.

FIG. 16 is a flowchart showing a method of operating the display device in the fingerprint sensing mode according to an exemplary embodiment of the present disclosure.

Referring to FIGS. 10 and 16, the touch sensing unit TSU senses the user input TC and provides the touch sensing signal corresponding to the position information of the user input TC to the touch sensing circuit TSC (S300). The touch sensing circuit TSC transmits the touch sensing signal provided from the touch sensing unit TSU to the panel driving circuit PDC shown in FIG. 3C.

The panel driving circuit PDC sets the touch area TA based on the position information from the touch sensing unit TSU (S310).

The panel driving circuit PDC selects the light emitting area EA corresponding to the touch area TA. The panel driving circuit PDC controls the display unit DU such that the brightness of the light emitting area EA of the display unit DU increases. The panel driving circuit PDC displays the message MSG through the predetermined area of the display unit DU and increases the brightness of the light emitting area EA (320).

The panel driving circuit PDC controls the fingerprint sensing unit FSU to sense the fingerprint (S330). The panel driving circuit PDC provides a signal that selects the sensing area SA of the fingerprint sensing unit FSU corresponding to the touch area TA to the readout circuit ROC. The readout circuit ROC receives the fingerprint sensing signal from the sensing area SA of the fingerprint sensing unit FSU in accordance with the user input TC (S330)

The readout circuit ROC compensates for the received fingerprint sensing signal using the compensation value (S340).

Accordingly, although the characteristic distribution of the fingerprint sensing pixels SP (refer to FIG. 6) exists, the readout circuit ROC may obtain the fingerprint sensing signal compensated by the compensation value, and thus, the fingerprint sensing performance may be improved.

In addition, as the display device DD periodically performs the test mode shown in FIG. 14, for example, every 5 days, the compensation value may be calculated by reflecting deterioration of characteristics due to the use of the display device DD. Thus, deterioration in fingerprint sensing performance of the display device DD may be prevented.

Figure 17A:
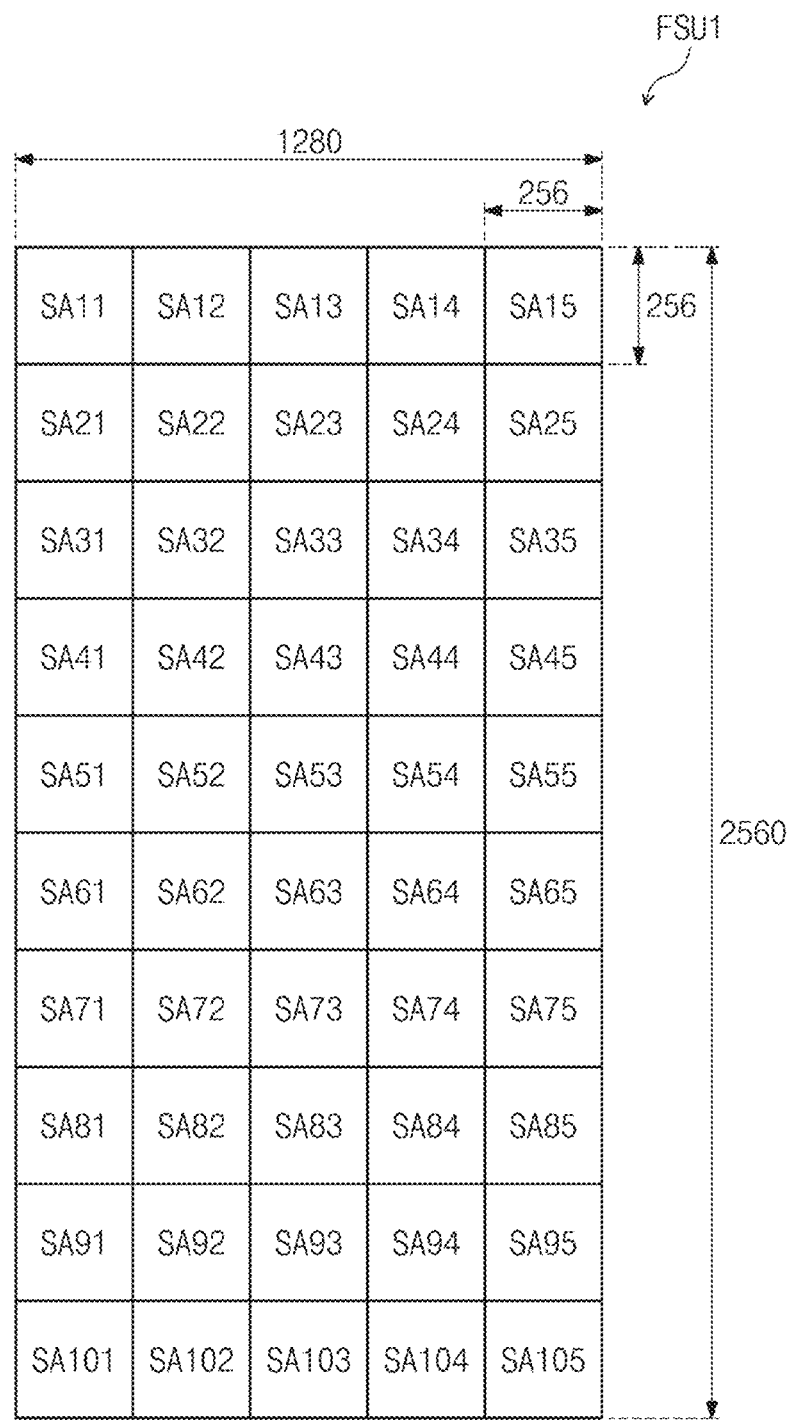
FIGS. 17A to 17C are views showing fingerprint sensing units according to an embodiment of the inventive concepts.
Figure 17B:
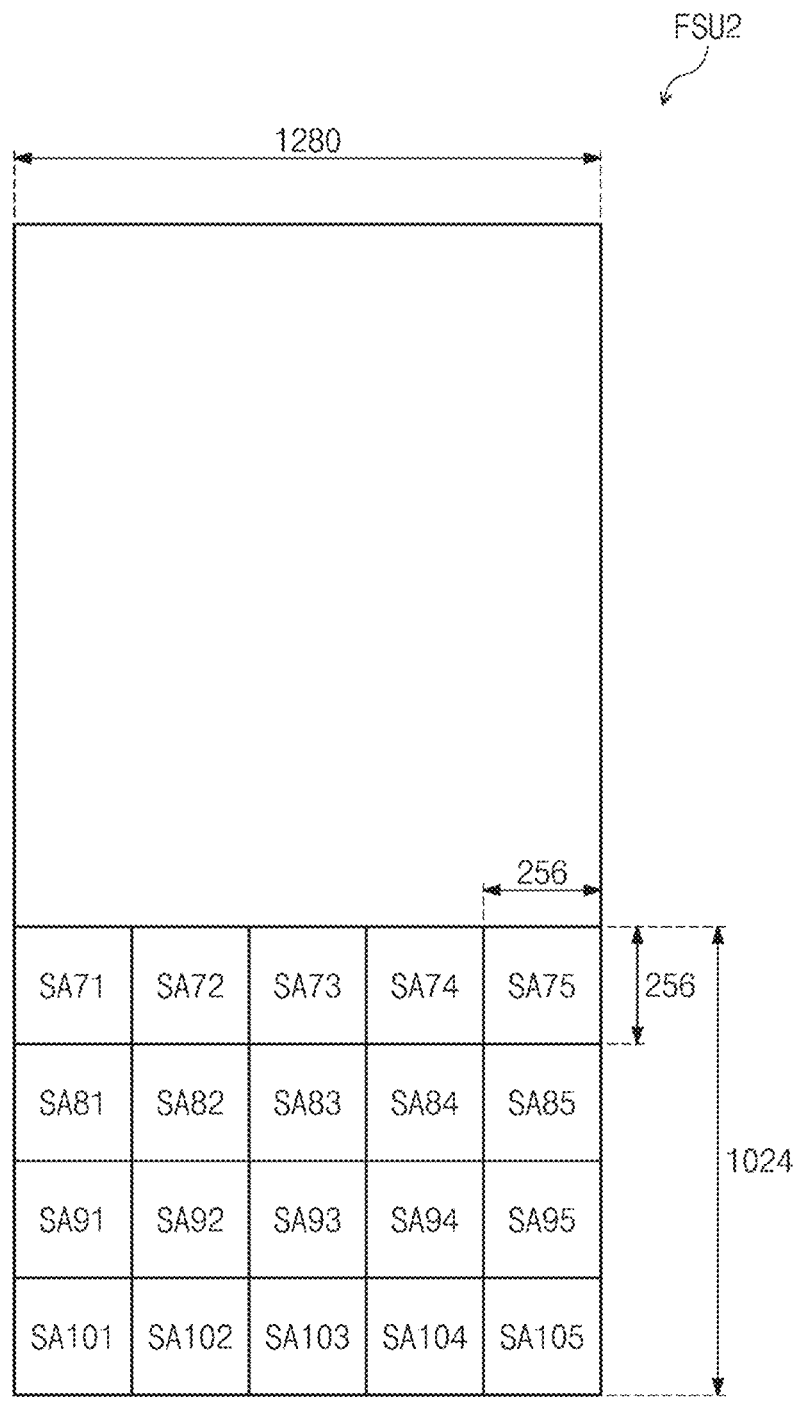
Figure 17C:
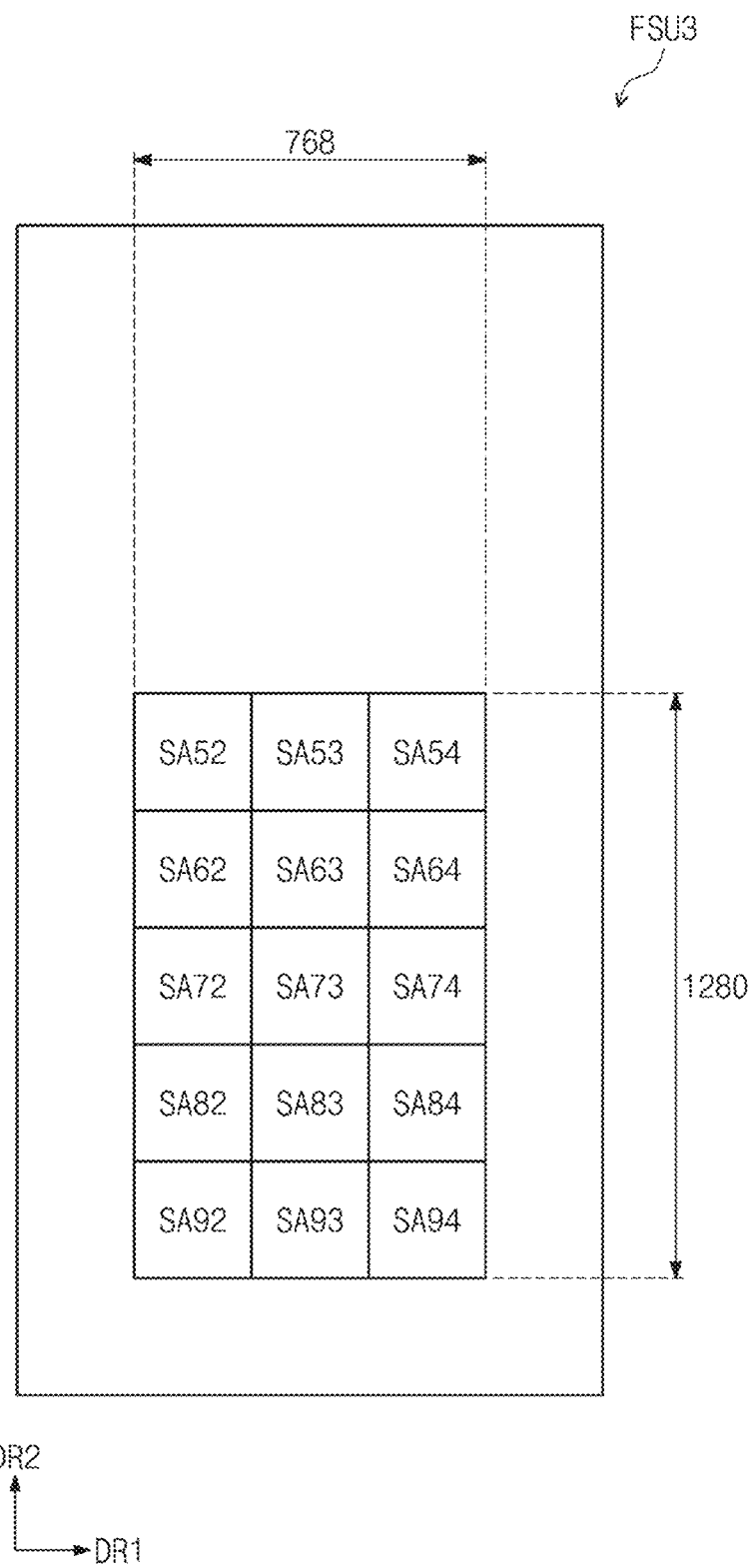

FIGS. 17A to 17C are views showing fingerprint sensing units according to an exemplary embodiment of the present disclosure.

Referring to FIG. 17A, a fingerprint sensing unit FSU1 may include 1280 by 2560 (1280×2560) fingerprint sensing pixels SP defined by 1280 fingerprint sensing pixels arranged in the first direction DR1 and 2560 fingerprint sensing pixels arranged in the second direction DR2. In addition, the fingerprint sensing unit FSU1 may include 5 by 10 (5×10) sensing areas SA1 to SA15, SA21 to SA25, SA31 to SA35, SA41 to SA45, SA51 to SA55, SA61 to SA65, SA71 to SA75, SA81 to SA85, SA91 to SA95, and SA101 to SA105 defined by 5 sensing areas arranged in the first direction DR1 and 10 sensing areas arranged in the second direction DR2. Each of the sensing areas SA11 to SA15, SA21 to SA25, SA31 to SA35, SA41 to SA45, SA51 to SA55, SA61 to SA65, SA71 to SA75, SA81 to SA85, SA91 to SA95, and SA101 to SA105 may include 256 by 256 (256×256) fingerprint sensing pixels SP defined by 256 fingerprint sensing pixels arranged in the first direction DR1 and 256 fingerprint sensing pixels arranged in the second direction DR2.

In the test mode shown in FIG. 14, the readout circuit ROC (refer to FIG. 7) may sequentially test the sensing areas SA11 to SA15, SA21 to SA25, SA31 to SA35, SA41 to SA45, SA51 to SA55, SA61 to SA65, SA71 to SA75, SA81 to SA85, SA91 to SA95, and SA101 to SA105. For example, the readout circuit ROC may perform the test on the sensing area SA11 to calculate the compensation value with respect to the fingerprint sensing pixels SP in the sensing area SA11 and then may perform the test on the sensing area SA12 to calculate the compensation value with respect to the fingerprint sensing pixels SP in the sensing area SA12. In this manner, the compensation values for all the fingerprint sensing pixels SP in the sensing areas SA11 to SA15, SA21 to SA25, SA31 to SA35, SA41 to SA45, SA51 to SA55, SA61 to SA65, SA71 to SA75, SA81 to SA85, SA91 to SA95, and SA101 to SA105 may be calculated.

Referring to FIG. 17B, a fingerprint sensing unit FSU2 may include fingerprint sensing pixels SP only in some areas. The fingerprint sensing unit FSU2 shown in FIG. 17B may include the fingerprint sensing pixels SP only in a lower portion in the second direction DR2, however, the present disclosure should not be limited thereto or thereby.

The fingerprint sensing unit FSU2 may include 1280 by 1024 (1280×1024) fingerprint sensing pixels SP defined by 1280 fingerprint sensing pixels arranged in the first direction DR1 and 1024 fingerprint sensing pixels arranged in the second direction DR2. In addition, the fingerprint sensing unit FSU2 may include 5 by 4 (5×4) sensing areas SA71 to SA75, SA81 to SA85, SA91 to SA95, and SA101 to SA105 defined by 5 sensing areas arranged in the first direction DR1 and 4 sensing areas arranged in the second direction DR2. Each of the sensing areas SA71 to SA75, SA81 to SA85, SA91 to SA95, and SA101 to SA105 may include 256 by 256 (256×256) fingerprint sensing pixels SP defined by 256 fingerprint sensing pixels arranged in the first direction DR1 and 256 fingerprint sensing pixels arranged in the second direction DR2.

In the test mode shown in FIG. 14, the readout circuit ROC (refer to FIG. 7) may sequentially test the sensing areas SA71 to SA75, SA81 to SA85, SA91 to SA95, and SA101 to SA105. For example, the readout circuit ROC may perform the test on the sensing area SA71 to calculate the compensation value with respect to the fingerprint sensing pixels SP in the sensing area SA71 and then may perform the test on the sensing area SA72 to calculate the compensation value with respect to the fingerprint sensing pixels SP in the sensing area SA72. In this manner, the compensation values for all the fingerprint sensing pixels SP in the sensing areas SA71 to SA75, SA81 to SA85, SA91 to SA95, and SA101 to SA105 may be calculated.

Referring to FIG. 17C, a fingerprint sensing unit FSU3 may include fingerprint sensing pixels SP only in some areas. The fingerprint sensing unit FSU3 shown in FIG. 17C may include the fingerprint sensing pixels SP only in a center of a lower portion in the second direction DR2, however, the present disclosure should not be limited thereto or thereby.

The fingerprint sensing unit FSU3 may include 768 by 1280 (768×1280) fingerprint sensing pixels SP defined by 768 fingerprint sensing pixels arranged in the first direction DR1 and 1280 fingerprint sensing pixels arranged in the second direction DR2. In addition, the fingerprint sensing unit FSU3 may include 3 by 5 (3×5) sensing areas SA52 to SA54, SA62 to SA64, SA72 to SA74, SA82 to SA84, and SA92 to SA94 defined by 3 sensing areas arranged in the first direction DR1 and 5 sensing areas arranged in the second direction DR2. Each of the sensing areas SA52 to SA54, SA62 to SA64, SA72 to SA74, SA82 to SA84, and SA92 to SA94 may include 256 by 256 (256×256) fingerprint sensing pixels SP defined by 256 fingerprint sensing pixels arranged in the first direction DR1 and 256 fingerprint sensing pixels arranged in the second direction DR2.

In the test mode shown in FIG. 14, the readout circuit ROC (refer to FIG. 7) may sequentially test the sensing areas SA52 to SA54, SA62 to SA64, SA72 to SA74, SA82 to SA84, and SA92 to SA94. For example, the readout circuit ROC may perform the test on the sensing area SA52 to calculate the compensation value with respect to the fingerprint sensing pixels SP in the sensing area SA52 and then may perform the test on the sensing area SA53 to calculate the compensation value with respect to the fingerprint sensing pixels SP in the sensing area SA53. In this manner, the compensation values for all the fingerprint sensing pixels SP in the sensing areas SA52 to SA54, SA62 to SA64, SA72 to SA74, SA82 to SA84, and SA92 to SA94 may be calculated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device that is capable of being set in an operation state or in a non-operation state, comprising:
    a display unit displaying an image;
    a fingerprint sensing unit disposed on one surface of the display unit and comprising fingerprint sensing pixels to sense a fingerprint; and a readout circuit configured to provide a selection signal to the fingerprint sensing unit to select a predetermined amount of fingerprint sensing pixels from the fingerprint sensing pixels as a sensing area and receive a fingerprint sensing signal from the sensing area, wherein the readout circuit accumulates the fingerprint sensing signal provided from the fingerprint sensing pixels in the sensing area during a test mode to measure a characteristic distribution of the fingerprint sensing signals when the display device is in the non-operation state and calculates a compensation value corresponding to the characteristic distribution based on a difference between the accumulated fingerprint sensing signal and a reference value.

2. The display device of claim 1, wherein the readout circuit configured to compensate for the fingerprint sensing signal provided from the fingerprint sensing pixels in the sensing area using the compensation value during a fingerprint sensing mode.

3. The display device of claim 1, wherein the readout circuit further comprises a memory, and the readout circuit receives the fingerprint sensing signal from the fingerprint sensing pixels in the sensing area N (where N is a natural number) times during the test mode and accumulates and stores the received fingerprint sensing signals in the memory.

4. The display device of claim 1, wherein the reference value is computed as an average of the accumulated fingerprint sensing signal of all fingerprint sensing pixels in the sensing area computed N separate times (where N is a natural number greater than or equal to one).

5. The display device of claim 1, wherein the readout circuit configured to perform the test mode when the display unit is in the non-operation state.

6. The display device of claim 1, wherein the fingerprint sensing unit comprises a plurality of sensing units, each of the sensing units comprises x by y fingerprint sensing pixels defined by x (where x is a natural number) fingerprint sensing pixels adjacent to each other in a first direction and y (where y is a natural number) fingerprint sensing pixels adjacent to each other in a second direction, and the sensing area comprises at least one sensing unit among the sensing units.

7. The display device of claim 6, wherein each of the fingerprint sensing pixels is connected to a plurality of fingerprint scan lines and a plurality of fingerprint sensing lines, and the fingerprint sensing unit further comprises a fingerprint scan driving circuit that sequentially drives the fingerprint scan lines included in the sensing area among the fingerprint scan lines.

8. The display device of claim 7, wherein the fingerprint scan driving circuit comprises a plurality of scan blocks respectively corresponding to the sensing units arranged in the second direction, and each of the scan blocks sequentially drives the fingerprint scan lines in a corresponding sensing unit in response to the block selection signal.

9. The display device of claim 7, wherein the readout circuit receives the fingerprint sensing signal from fingerprint sensing lines included in the sensing area among the fingerprint sensing lines.

10. The display device of claim 7, wherein the readout circuit comprises:
a plurality of readout blocks respectively corresponding to the sensing units arranged in the first direction; and
a control circuit configured to output an enable signal, and each of the readout blocks receives the fingerprint sensing signal from the fingerprint sensing lines in the sensing units included in the sensing area among the sensing units in response to the enable signal.

11. The display device of claim 1, wherein the display unit comprises a display area in which pixels are arranged and a non-display area defined adjacent to the display area, and the fingerprint sensing pixels of the fingerprint sensing unit are arranged in a fingerprint sensing area corresponding to the display area.

12. A display device that is capable of being set to an operation state or in a non-operation state, comprising:
a display unit comprising a plurality of pixels;
a panel driving circuit configured to drive the display unit;
a touch sensing unit disposed on the display unit to sense an external touch;
a touch sensing circuit configured to drive the touch sensing unit;
a fingerprint sensing unit disposed on one surface of the display unit and comprising fingerprint sensing pixels to sense a fingerprint; and
a readout circuit configured to output a selection signal to the fingerprint sensing unit to select a predetermined amount of fingerprint sensing pixels from the fingerprint sensing pixels as a sensing area and receive a fingerprint sensing signal from the sensing area, wherein the panel driving circuit controls the readout circuit to be operated in a test mode to measure a characteristic distribution of the fingerprint sensing pixels when the display unit is in the non-operation state and not in the operation state, and the readout circuit accumulates the fingerprint sensing signal provided from the fingerprint sensing pixels in the sensing area during the test mode and calculates a compensation value based on a difference between the accumulated fingerprint sensing signal and a reference value.

13. The display device of claim 12, wherein the readout circuit configured to compensate for the fingerprint sensing signal provided from the fingerprint sensing pixels in the sensing area using the compensation value during a fingerprint sensing mode.

14. The display device of claim 12, wherein the readout circuit further comprises a memory, and the readout circuit receives the fingerprint sensing signal from the fingerprint sensing pixels in the sensing area N (where N is a natural number) times during the test mode and accumulates and stores the received fingerprint sensing signals in the memory.

15. The display device of claim 12, wherein the reference value is computed as an average of the accumulated fingerprint sensing signal of all fingerprint sensing pixels in the sensing area computed N separate times (where N is a natural number greater than or equal to one).

16. The display device of claim 12, wherein the panel driving circuit controls the display unit such that a brightness of a light emitting area of the display unit is at a predetermined level when receiving a touch sensing signal corresponding to an arbitrary touch area from the touch sensing circuit and controls the readout circuit to sense a fingerprint from the sensing area of the fingerprint sensing unit, and the touch area, the light emitting area, and the sensing area correspond to each other.

17. A method of operating a display device comprising a display unit configured to display an image and a fingerprint sensing unit comprising fingerprint sensing pixels to sense a fingerprint, the display unit capable of being set to an operation state or in a non-operation state, the method comprising:

performing a test mode to measure a characteristic distribution of the fingerprint sensing pixels when the display unit is in the non-operation state; and performing a fingerprint sensing mode when the display unit is in the operation state, wherein the test mode comprises:

receiving a test fingerprint sensing signal from the fingerprint sensing pixels;

accumulating the test fingerprint sensing signal and outputting an accumulated fingerprint sensing signal; and calculating a compensation value corresponding to the characteristic distribution based on a difference between the accumulated fingerprint sensing signal and a reference value, wherein the fingerprint sensing mode comprises:

receiving a fingerprint sensing signal from the fingerprint sensing pixels; and compensating for the fingerprint sensing signal provided from the fingerprint sensing pixels using the compensation value.

18. The method of claim 17, wherein the reference value is computed as an average of the accumulated fingerprint sensing signal of all fingerprint sensing pixels in the sensing area computed N separate times (where N is a natural number greater than or equal to one).

* * * * *